United States Patent
Yoneda

(10) Patent No.: US 8,564,331 B2
(45) Date of Patent: Oct. 22, 2013

(54) SEMICONDUCTOR DEVICE

(75) Inventor: Seiichi Yoneda, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/461,811

(22) Filed: May 2, 2012

(65) Prior Publication Data

US 2012/0286823 A1    Nov. 15, 2012

(30) Foreign Application Priority Data

May 13, 2011    (JP) ................. 2011-108358

(51) Int. Cl.
*H03K 19/096*    (2006.01)

(52) U.S. Cl.
USPC ............. 326/95; 326/93; 326/98; 326/112

(58) Field of Classification Search
None
See application file for complete search history.

(56) References Cited

U.S. PATENT DOCUMENTS

| | | | |
|---|---|---|---|
| 4,809,225 A | 2/1989 | Dimmler et al. | |
| 5,528,032 A | 6/1996 | Uchiyama | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,783,365 B2 * | 8/2004 | Seltzer et al. | 433/84 |
| 6,836,428 B2 | 12/2004 | Nakura et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

International Search Report (Application No. PCT/JP2012/062073) Dated Jun. 12, 2012.

(Continued)

*Primary Examiner* — Anh Tran
(74) *Attorney, Agent, or Firm* — Eric J. Robinson; Robinson Intellectual Property Law Office, P.C.

(57) ABSTRACT

A semiconductor device in which an input terminal is electrically connected to a first terminal of a first transmission gate; a second terminal of the first transmission gate is electrically connected to a first terminal of a first inverter and a second terminal of a functional circuit; a second terminal of the first inverter and a first terminal of the functional circuit are electrically connected to a first terminal of a second transmission gate; a second terminal of the second transmission gate is electrically connected to a first terminal of a second inverter and a second terminal of a clocked inverter; a second terminal of the second inverter and a first terminal of the clocked inverter are electrically connected to an output terminal; and the functional circuit includes a data holding portion between a transistor with small off-state current and a capacitor.

21 Claims, 22 Drawing Sheets

(56) References Cited

U.S. PATENT DOCUMENTS

| | | |
|---|---|---|
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0264956 A1* | 10/2010 | Yin et al. ...................... 326/120 |
| 2011/0010493 A1 | 1/2011 | Kimura et al. |
| 2011/0101332 A1 | 5/2011 | Yamazaki et al. |
| 2011/0101351 A1 | 5/2011 | Yamazaki |
| 2011/0121878 A1* | 5/2011 | Kato et al. .................... 327/215 |
| 2011/0148463 A1 | 6/2011 | Kato et al. |
| 2011/0187410 A1 | 8/2011 | Kato et al. |
| 2012/0170355 A1 | 7/2012 | Ohmaru et al. |
| 2012/0195115 A1 | 8/2012 | Fujita et al. |
| 2012/0195122 A1 | 8/2012 | Ohmaru |
| 2012/0206956 A1 | 8/2012 | Fujita |
| 2012/0230078 A1 | 9/2012 | Fujita |
| 2012/0230138 A1 | 9/2012 | Endo |
| 2012/0243340 A1 | 9/2012 | Kobayashi et al. |
| 2012/0250407 A1 | 10/2012 | Kurokawa |
| 2012/0257439 A1 | 10/2012 | Kurokawa |
| 2012/0257440 A1 | 10/2012 | Takemura |
| 2012/0262982 A1 | 10/2012 | Takemura |
| 2012/0262983 A1 | 10/2012 | Kobayashi |
| 2012/0269013 A1 | 10/2012 | Matsuzaki |
| 2012/0271984 A1 | 10/2012 | Ohmaru et al. |
| 2012/0274356 A1 | 11/2012 | Takahashi |
| 2012/0274361 A1 | 11/2012 | Miyake |
| 2012/0274378 A1 | 11/2012 | Fujita |
| 2012/0274379 A1 | 11/2012 | Yoneda et al. |
| 2012/0275214 A1 | 11/2012 | Atsumi et al. |
| 2012/0280715 A1 | 11/2012 | Sekine |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 | 9/1994 |
| JP | 08-264794 A | 10/1996 |
| JP | 11-505377 | 5/1999 |
| JP | 2000-044236 A | 2/2000 |
| JP | 2000-077982 | 3/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-212477 A | 7/2004 |
| JP | 2004-273614 A | 9/2004 |
| JP | 2004-273732 A | 9/2004 |
| JP | 2006-203479 A | 8/2006 |
| JP | 2007-096055 | 4/2007 |
| JP | 2007-123861 | 5/2007 |
| JP | 2010-166255 | 7/2010 |
| WO | WO-2004/114391 | 12/2004 |

OTHER PUBLICATIONS

Written Opinion (Application No. PCT/JP2012/062073) Dated Jun. 12, 2012.

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

(56) References Cited

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of Igzo Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m = 3, 4, and 5), $InGaO_3(ZnO)3$, and $Ga_2O_3(ZnO)m$ (m = 7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous Gizo ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using Igzo Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y at al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-in. AMOLED Display With Driver Circuit Using Amorphous In—Ga—Zn—Oxide TFTS,", IDW '9 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 in. QVGA AMOLED Display Using In—Ga—Zn—Oxide TFTS With a Novel Passivation Layer,", SID

(56) References Cited

OTHER PUBLICATIONS

Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the IN2O3 and SC2O3—A2O3—BO Systems [A; FE, GA, or AL; B: MG, MN, FE, NI, CU, or ZN] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005 vol. 87, pp. 122102-1-122102-3.

Oba.F et al., "Defect energetics in ZnO: A hybrid Hartree-Fock density functional study,", Phys. Rev. B (Physical Review B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

● In
☾ Sn
ᴄ Zn
● O

SEMICONDUCTOR DEVICE

TECHNICAL FIELD

The present invention relates to a semiconductor device. In this specification, a semiconductor device refers to a semiconductor element itself or a device including a semiconductor element. As an example of such a semiconductor element, for example, a thin film transistor can be given. Therefore, the semiconductor device includes a liquid crystal display device, a memory device, and the like.

BACKGROUND ART

In recent years, metal oxides having semiconductor characteristics (hereinafter referred to as oxide semiconductors) have attracted attention. Oxide semiconductors may be applied to transistors (see Patent Documents 1 and 2).

REFERENCES

[Patent Document 1] Japanese Published Patent Application No. 2007-123861
[Patent Document 2] Japanese Published Patent Application No. 2007-096055

DISCLOSURE OF INVENTION

In a display device, a memory device, and the like, semiconductor elements are arranged in a matrix. The semiconductor elements arranged in a matrix are controlled by a peripheral driver circuit. One example of circuits included in the peripheral driver circuit is a D flip-flop circuit.

It is an object of an embodiment of the present invention to provide a D flip-flop circuit which can hold data even when being powered off while performing processing and which has a smaller area than a conventional one.

One embodiment of the present invention is a semiconductor device including a circuit which includes an input terminal, a first transmission gate, a second transmission gate, a first inverter, a second inverter, a functional circuit, a clocked inverter, and an output terminal. The input terminal is electrically connected to a first terminal of the first transmission gate. A second terminal of the first transmission gate is electrically connected to a first terminal of the first inverter and a second terminal of the functional circuit. A second terminal of the first inverter and a first terminal of the functional circuit are electrically connected to a first terminal of the second transmission gate. A second terminal of the second transmission gate is electrically connected to a first terminal of the second inverter and a second terminal of the clocked inverter. A second terminal of the second inverter and a first terminal of the clocked inverter are electrically connected to the output terminal. The functional circuit includes a first p-channel transistor, a second p-channel transistor, a transistor with small off-state current, and a capacitor. One of a source and a drain of the first p-channel transistor is electrically connected to a first wiring. The other of the source and the drain of the first p-channel transistor is electrically connected to one of a source and a drain of the second p-channel transistor. A timing signal is input to a gate of the first p-channel transistor. The other of the source and the drain of the second p-channel transistor is electrically connected to one of a source and a drain of the transistor with small off-state current and the first terminal of the first inverter. A gate of the second p-channel transistor is electrically connected to the second terminal of the first inverter. The other of the source and the drain of the transistor with small off-state current is electrically connected to one electrode of the capacitor. The other electrode of the capacitor is electrically connected to a second wiring.

In the semiconductor device, it is preferable that the first wiring and the second wiring each be a power supply potential line supplied with a constant potential, and that the potential of the first wiring be higher than the potential of the second wiring.

At the time of restart of the semiconductor device, it is possible that a clock signal is not input to the clocked inverter and a wiring to which the clock signal is input is held at a constant potential, and that the timing signal input to the gate of the first p-channel transistor is set to an H level before the transistor with small off-state current is turned on. After the restart, it is possible that the same signal as the clock signal input to the clocked inverter is input as the timing signal.

It is preferable that a node in a floating state in the semiconductor device having the above configuration be electrically connected to one of a source and a drain of a reset transistor, that the other of the source and the drain of the reset transistor be electrically connected to the first wiring or the second wiring, and that a reset signal be input to the reset transistor.

In the above configuration, it is preferable that the off-state current per micrometer of channel width of the transistor with small off-state current be smaller than or equal to 10 aA at room temperature.

Note that in an explanation focusing on part of a wiring, the wiring is also referred to as a "node".

According to one embodiment of the present invention, it is possible to obtain a D flip-flop circuit which can hold data even when being powered off while performing processing and which has a smaller area than a conventional one.

BEST MODE FOR CARRYING OUT THE INVENTION

Embodiments of the present invention will be described in detail below with reference to drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments.

A D flip-flop circuit which is one embodiment of the present invention will be described.

Figure 1A:
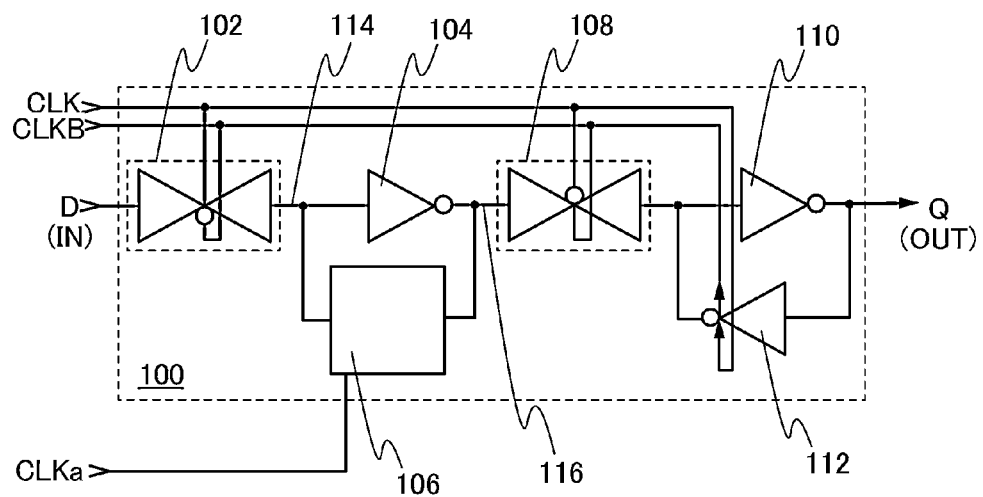
FIGS. 1A and 1B illustrate a D flip-flop circuit of a semiconductor device in one embodiment of the present invention.
Figure 2A:
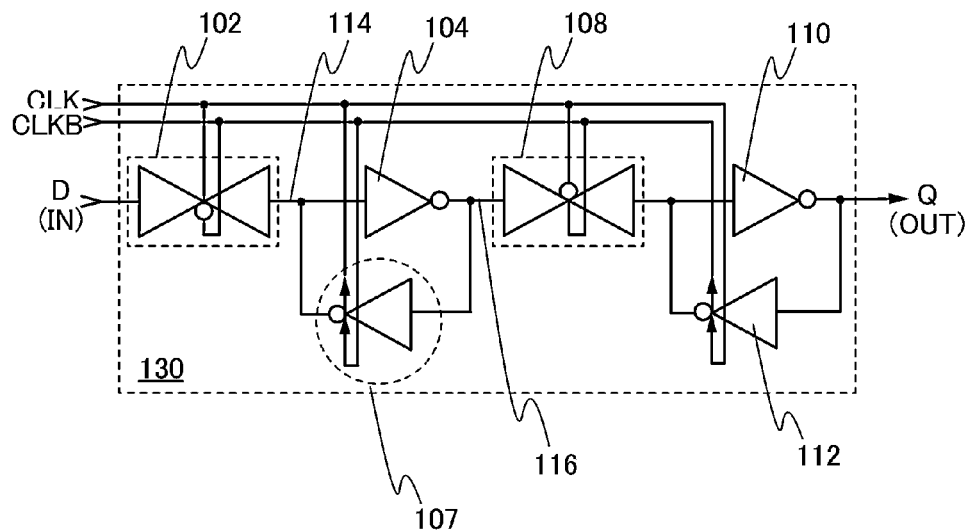
FIGS. 2A and 2B illustrate a D flip-flop circuit of a conventional semiconductor device.

FIG. 1A is a circuit diagram of a D flip-flop circuit 100 which is one embodiment of the present invention, and FIG. 2A is a circuit diagram of a conventional D flip-flop circuit 130.

Figure 2B:
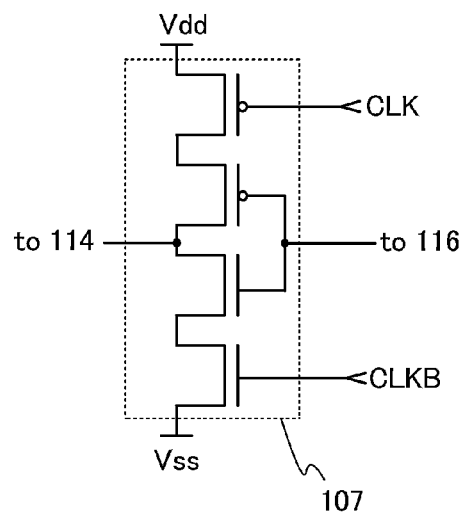

In the D flip-flop circuit 130 illustrated in FIG. 2A, an input terminal is electrically connected to a first terminal of a first transmission gate 102. A second terminal of the first transmission gate 102 is electrically connected to a first terminal of a first inverter 104 and a second terminal of a clocked inverter 107 through a node 114. A second terminal of the first inverter 104 and a first terminal of the clocked inverter 107 are electrically connected to a first terminal of a second transmission gate 108 through a node 116. A second terminal of the second transmission gate 108 is electrically connected to a first terminal of a second inverter 110 and a second terminal of a clocked inverter 112. A second terminal of the second inverter 110 and a first terminal of the clocked inverter 112 are electrically connected to an output terminal. Note that FIG. 2B illustrates a configuration of the clocked inverter 107.

In the D flip-flop circuit 100 illustrated in FIG. 1A, an input terminal is electrically connected to a first terminal of a first transmission gate 102. A second terminal of the first transmission gate 102 is electrically connected to a first terminal of a first inverter 104 and a second terminal of a functional circuit 106 through a node 114. A second terminal of the first inverter 104 and a first terminal of the functional circuit 106 are electrically connected to a first terminal of a second transmission gate 108 through a node 116. A second terminal of the second transmission gate 108 is electrically connected to a first terminal of a second inverter 110 and a second terminal of a clocked inverter 112. A second terminal of the second inverter 110 and a first terminal of the clocked inverter 112 are electrically connected to an output terminal.

Thus, the D flip-flop circuit 100 illustrated in FIG. 1A differs from the D flip-flop circuit 130 illustrated in FIG. 2A in that the clocked inverter 107 is replaced with the functional circuit 106.

Figure 1B:
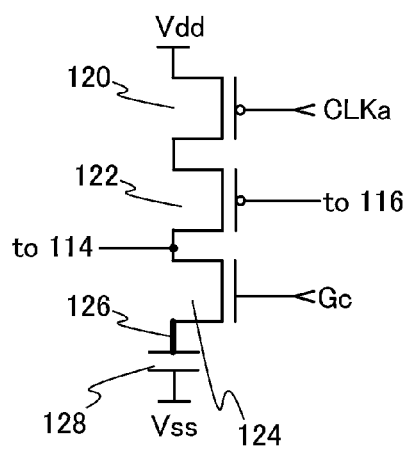

The functional circuit 106 illustrated in FIG. 1B includes a first p-channel transistor 120, a second p-channel transistor 122, a transistor 124 with small off-state current, and a capacitor 128.

One of a source and a drain of the first p-channel transistor 120 is electrically connected to a high power supply potential line Vdd. The other of the source and the drain of the first p-channel transistor 120 is electrically connected to one of a source and a drain of the second p-channel transistor 122. A timing signal CLKa is input to a gate of the first p-channel transistor 120. The other of the source and the drain of the second p-channel transistor 122 is electrically connected to one of a source and a drain of the transistor 124 and the node 114. A gate of the second p-channel transistor 122 is electrically connected to the node 116. The other of the source and the drain of the transistor 124 is electrically connected to one electrode of the capacitor 128. The other electrode of the capacitor 128 is electrically connected to a low power supply potential line Vss. A data holding portion 126 is provided between the other of the source and the drain of the transistor 124 and the one electrode of the capacitor 128.

Figure 3:
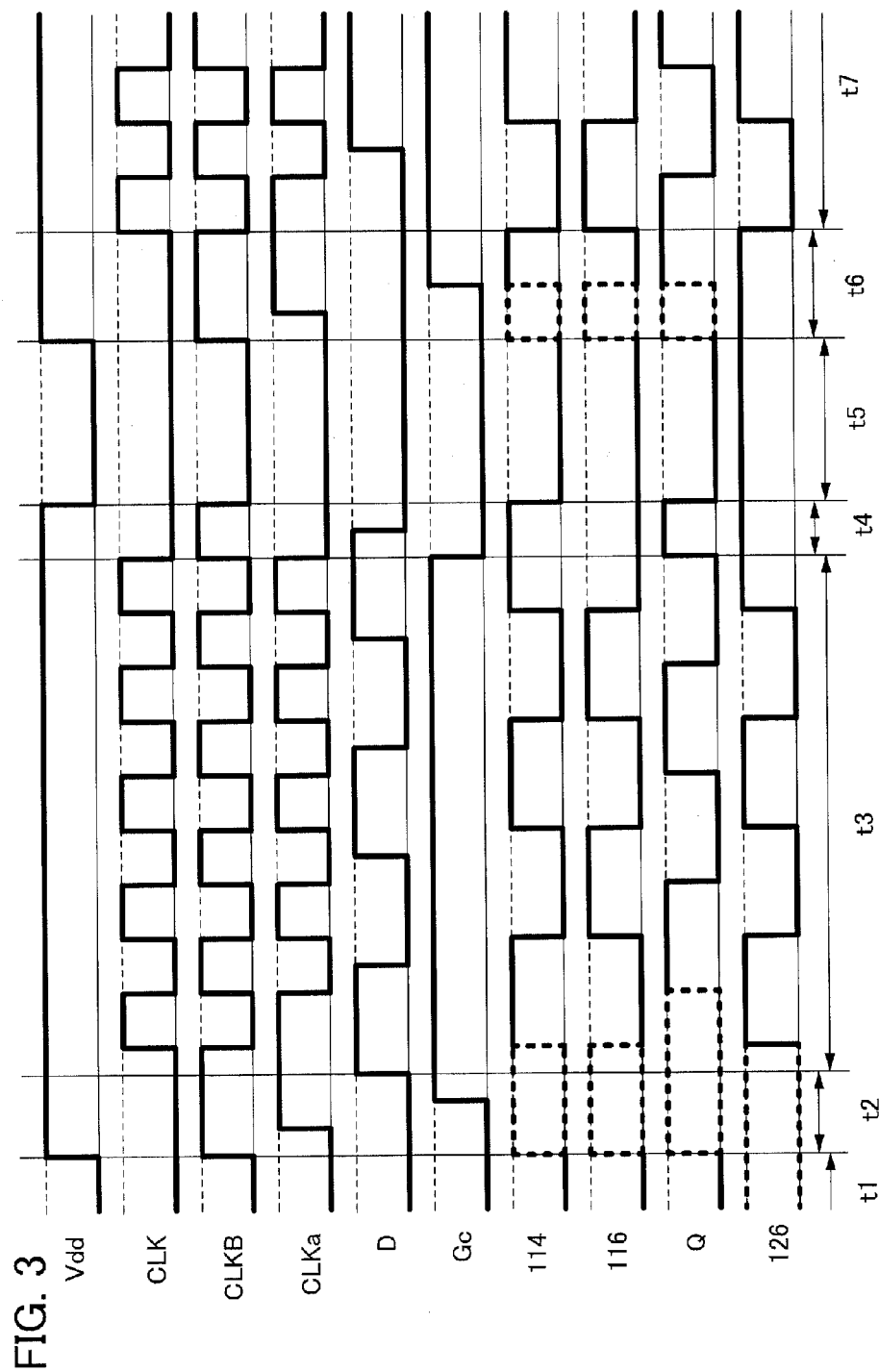
FIG. 3 is a timing chart illustrating an operation of the D flip-flop circuit in FIGS. 1A and 1B.
Figure 4:
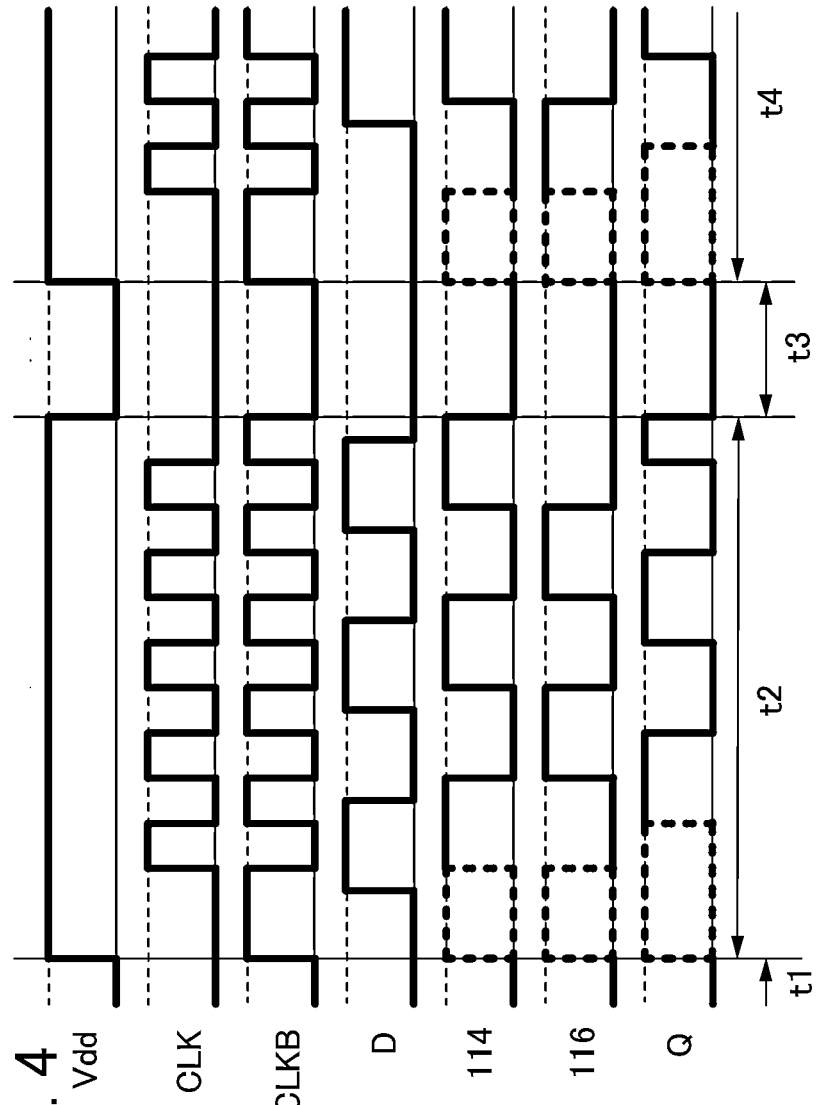
FIG. 4 is a timing chart illustrating an operation of the D flip-flop circuit in FIGS. 2A and 2B.

FIG. 3 is a timing chart illustrating an operation of the D flip-flop circuit 100 in FIG. 1A, and FIG. 4 is a timing chart illustrating an operation of the D flip-flop circuit 130 in FIG. 2A.

First, the timing chart in FIG. 4 is described. FIG. 4 illustrates four periods t1 to t4. The period t1 is an off period; the period t2, an on period; the period t3, an off period; and the period t4, an on period. Note that a thick dashed line indicates that it cannot be determined whether the potential is at a high level or at a low level.

The potential of the high power supply potential line Vdd is at an H level in the on periods and at an L level in the off periods.

A clock signal CLK is input at a constant frequency only in the on periods.

An inverted clock signal CLKB is obtained by inverting the clock signal CLK. Note that when the power is turned off (when Vdd is at the L level), the inverted clock signal CLKB is at the L level as is the clock signal CLK.

A data signal D is input as data to the D flip-flop circuit 130.

First, the D flip-flop circuit 130 is switched from the off state (the period t1) to the on state (the period t2). By switching the D flip-flop circuit 130 to the on state, Vdd is set to the H level, and the clock signal CLK and the inverted clock signal CLKB are input. When the data signal D is input here, the potential of the node 114 which is an indeterminate potential at the beginning is set to the H level (or the L level) depending on the data signal D. In addition, the potential of the node 116 which is also an indeterminate potential at the beginning is set to the level opposite to the level of the potential of the node 114.

In other words, the potential of the node 116 is set to the L level when the potential of the node 114 is at the H level, and the potential of the node 116 is set to the H level when the potential of the node 114 is at the L level. At that time, an output signal Q depends on the data signal D (the period t2).

Next, by switching the D flip-flop circuit 130 from the on state (the period t2) to the off state (the period t3), the input of all the signals is stopped (the period t3).

Then, by switching the D flip-flop circuit 130 from the off state (the period t3) to the on state (the period t4) again, Vdd is set to the H level, and the clock signal CLK and the inverted clock signal CLKB are input. When the data signal D is input here, although the output signal Q depends on the data signal D as in the period t2, the potentials of the node 114 and the node 116 change and are indeterminate owing to the period t3, and therefore the output signal Q is also indeterminate at the beginning of the period t4 (the period t4).

In other words, the D flip-flop circuit 130 cannot hold the same data as before being switched to the off state, and therefore cannot be switched to the off state while performing processing.

The timing chart in FIG. 3 is described. FIG. 3 illustrates seven periods t1 to t7. The period t1 is an off period; the period t2, a starting period; the period t3, a processing period; the period t4, a data holding period; the period t5, an off period; the period t6, a restarting period; and the period t7, a processing period. Note that in the restarting period and the processing periods, the D flip-flop circuit is switched on. Note that a thick dashed line indicates that it cannot be determined whether the potential is at a high level or at a low level.

A timing signal CLKa is generated based on a clock signal CLK in an external circuit.

First, the D flip-flop circuit 100 is switched from the off state (the period t1) to the on state (the period t2). By switching the D flip-flop circuit 100 to the on state, Vdd is set to the H level. The clock signal CLK is not input, whereas the timing signal CLKa is input. In addition, with a gate control signal Gc input, i.e., set to an H level, the starting period is terminated and the processing period is started (from the period t2 to the period t3).

In other words, in the starting period (the period t2), the clock signal CLK is not input to the clocked inverter 112, a wiring to which the clock signal CLK is input is held at a constant potential, and the timing signal CLKa input to the gate of the first p-channel transistor 120 is set to the H level before the transistor 124 is turned on. Then, from the period t3, the same signal as the clock signal CLK input to the clocked inverter 112 is input as the timing signal CLKa until the D flip-flop circuit 100 is switched off.

In the period t3, the input of a data signal D is started, and the transistor 124 is in an on state due to the input of the gate control signal Gc. Thus, the potential of the node 114 is set to the H level and the potential of the node 116 is set to the L level. By inputting the clock signal CLK and the inverted clock signal CLKB, the D flip-flop circuit 100 operates in a manner similar to the D flip-flop circuit 130 and outputs an output signal Q depending on the data signal D (the period t3).

Alternatively, instead of the clock signal CLK, the timing signal CLKa which is the same as the clock signal CLK may be input in the period t3.

Next, the gate control signal Gc is set to the L level to turn off the transistor 124, so that a data holding process is performed before the D flip-flop circuit 100 is powered off (the period t4). In this period t4, data of the node 114 is written to the data holding portion 126.

Then, the D flip-flop circuit 100 is switched from the on state (the data holding period (the period t4)) to the off state (the period t5). After that, when the D flip-flop circuit 100 is switched to the on state, Vdd is set to the H level (from the period t5 to the period t6). The clock signal CLK is not input, whereas the timing signal CLKa is input. In addition, with the gate control signal Gc input, i.e., set to the H level, the restarting period is terminated and the processing period is started (from the period t6 to the period t7). Then, the input of the data signal D is started again (the period t7).

The output signal Q is focused on here. Unlike in the period t2, the same data as shortly before the D flip-flop circuit 100 is switched from the on state (the data holding period (the period t4)) to the off state (the period t5) is output. This is because the same data as shortly before the switching is held by the data holding portion 126. The data holding portion 126 is provided between the source or the drain of the transistor 124 and one electrode of the capacitor 128 with the other electrode electrically connected to the low power supply potential line Vss. The data holding portion 126 capable of holding data even after being powered off as described above can be obtained using a transistor with small off-state current as the transistor 124.

As the transistor with small off-state current which can be used as the transistor 124, a transistor with a small off-state current of 10 aA/μm ($1 \times 10^{-17}$ A/μm) or less per micrometer of channel width at room temperature, preferably 1 aA/μm ($1 \times 10^{-18}$ A/μm) or less, further preferably 1 zA/μm ($1 \times 10^{-21}$ A/m) or less, still further preferably 1 yA/μm ($1 \times 10^{-24}$ A/m) or less, may be used.

In this manner, the D flip-flop circuit 100 illustrated in FIG. 1A can hold the same data as before the D flip-flop circuit 100 is switched to an off state, and can be switched to the off state while performing processing.

Note that another configuration in which a reset signal is input to the D flip-flop circuit 100 may be employed. The configuration in which a reset signal is input to the D flip-flop circuit 100 may be obtained by replacing the functional circuit 106 illustrated in FIG. 1B with a functional circuit 106 illustrated in FIG. 5. By inputting a reset signal, a node in a floating state can be set to an L level or an H level before the starting period (the period t2), so that a given node can be prevented from having a floating potential during operation.

Figure 5:
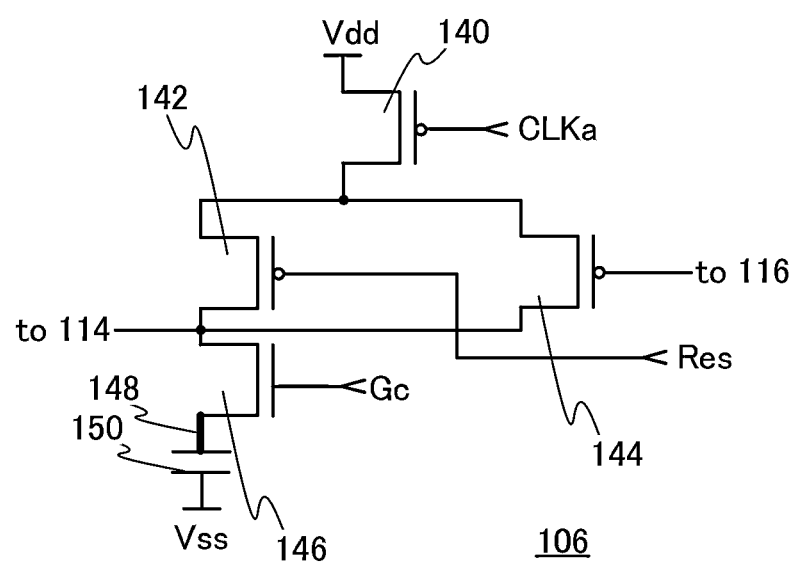
FIG. 5 illustrates a D flip-flop circuit of a semiconductor device in one embodiment of the present invention.

The functional circuit 106 illustrated in FIG. 5 includes a first p-channel transistor 140, a second p-channel transistor 142, a third p-channel transistor 144, a transistor 146 with small off-state current, and a capacitor 150.

One of a source and a drain of the first p-channel transistor 140 is electrically connected to a high power supply potential line Vdd. The other of the source and the drain of the first p-channel transistor 140 is electrically connected to one of a source and a drain of the second p-channel transistor 142 and one of a source and a drain of the third p-channel transistor 144. A timing signal CLKa is input to a gate of the first p-channel transistor 140. The other of the source and the drain of the second p-channel transistor 142 and the other of the source and the drain of the third p-channel transistor 144 are electrically connected to one of a source and a drain of the transistor 146 and a node 114. A reset signal Res is input to a gate of the second p-channel transistor 142. A gate of the third p-channel transistor 144 is electrically connected to a node 116. The other of the source and the drain of the transistor 146 is electrically connected to one electrode of the capacitor 150. The other electrode of the capacitor 150 is electrically connected to a low power supply potential line Vss. A data holding portion 148 is provided between the other of the source and the drain of the transistor 146 and the one electrode of the capacitor 150.

As the transistor 124 and the transistor 146 described above, oxide semiconductor transistors are preferably used.

Note that in the present invention, the transistors are not limited to those having specific structures and may have various structures. Thus, the transistors may be formed using polycrystalline silicon or may be formed using a silicon-on-insulator (SOI) substrate.

Although the transistor 124 and the transistor 146 included in the circuit according to the present invention are n-channel transistors, the present invention is not limited thereto and p-channel transistors may be used as appropriate.

Next, a transistor with small off-state current which can be used in the present invention will be described. As an example of the transistor with small off-state current, there is a transistor formed using a metal oxide which has semiconductor characteristics. As an example of a transistor other than the transistor with small off-state current, there is a transistor formed using a semiconductor substrate.

Figure 6:
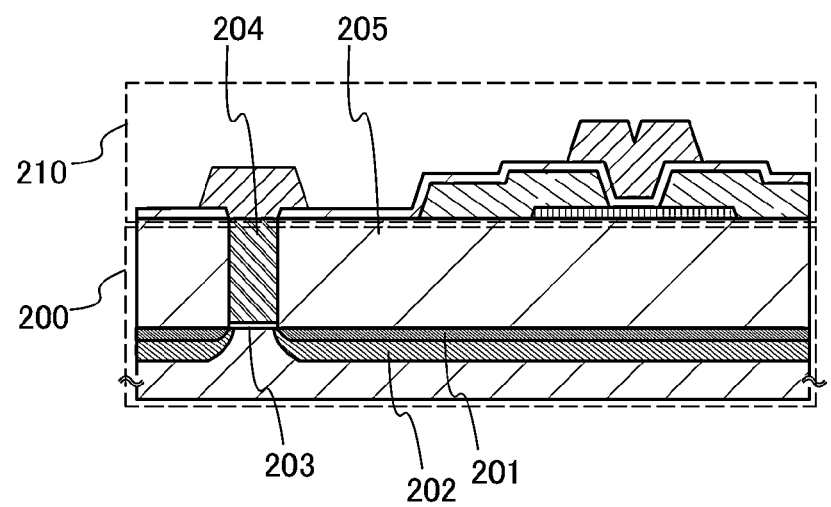
FIG. 6 is a schematic cross-sectional view of a transistor which can be applied to one embodiment of the present invention.

FIG. 6 illustrates examples of schematic cross-sectional structures of transistors which can be used in the present invention. In FIG. 6, a transistor with small off-state current is formed over a transistor formed using a semiconductor substrate. As the transistor formed using the semiconductor substrate, both a p-channel transistor and an n-channel transistor may be provided, or only either one may be provided.

The p-channel transistor and the n-channel transistor may be formed using the semiconductor substrate by a known method. After the p-channel transistor and the n-channel transistor are formed using the semiconductor substrate, the transistor with small off-state current is formed thereover. In other words, the transistor with small off-state current is formed over a semiconductor substrate 200 provided with the p-channel transistor and the n-channel transistor. As an example of the transistor with small off-state current, there is a transistor having a channel formation region in an oxide semiconductor layer.

Note that the semiconductor substrate 200 provided with the p-channel transistor and the n-channel transistor includes high-concentration impurity regions 201 serving as a source region and a drain region, low-concentration impurity regions 202, a gate insulating film 203, a gate electrode 204, and an interlayer insulating film 205 (FIG. 6).

Figure 7A:
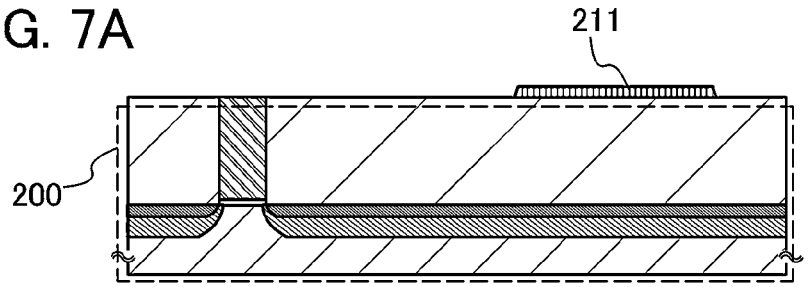
FIGS. 7A to 7D illustrate a method for manufacturing the transistor illustrated in FIG. 6.
Figure 7B:
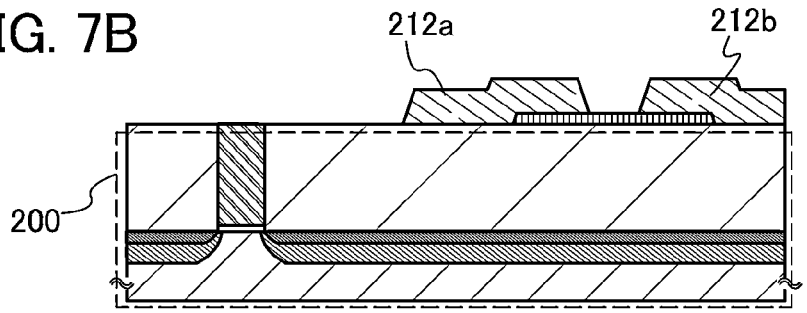
Figure 7C:
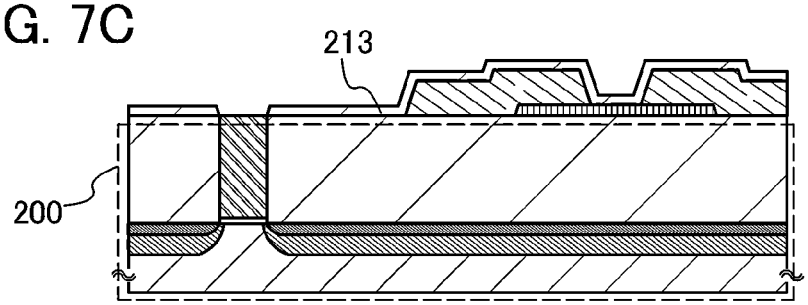
Figure 7D:
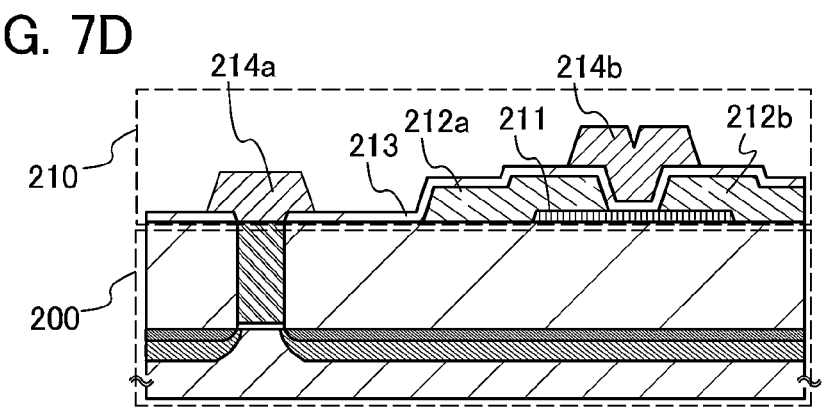

A transistor 210 having a channel formation region in an oxide semiconductor layer includes an oxide semiconductor layer 211 over the semiconductor substrate 200 provided with the p-channel transistor and the n-channel transistor, a source electrode 212a and a drain electrode 212b which are apart from each other and in contact with the oxide semiconductor layer 211, a gate insulating film 213 over at least a channel formation region of the oxide semiconductor layer 211, and a gate electrode 214b over the gate insulating film 213 so as to overlap with the oxide semiconductor layer 211 (FIG. 7D). Although not illustrated, an electrode 214a and the gate electrode 214b are electrically connected to each other, and the gate electrode 204 and the electrode 214a are electrically connected to each other.

The interlayer insulating film 205 also functions as a base insulating film for the oxide semiconductor layer 211.

The interlayer insulating film 205 contains oxygen at least on its surface and may be formed using an insulating oxide from which part of oxygen is released by heat treatment. As the insulating oxide from which part of oxygen is released by heat treatment, an insulating oxide containing a large amount of oxygen exceeding the stoichiometry is preferably used. This is because oxygen can be supplied to an oxide semiconductor film in contact with the interlayer insulating film 205 by the heat treatment.

As an example of the insulating oxide containing a large amount of oxygen exceeding the stoichiometry, silicon oxide represented by $SiO_x$ where x>2 can be given. However, one embodiment of the present invention is not limited thereto, and the interlayer insulating film 205 may be formed using silicon oxide, silicon oxynitride, silicon nitride oxide, aluminum oxynitride, gallium oxide, hafnium oxide, yttrium oxide, or the like.

Note that the interlayer insulating film 205 may be formed by stacking a plurality of films. The interlayer insulating film 205 may have a stacked structure in which a silicon oxide film is formed over a silicon nitride film, for example.

From the insulating oxide containing a large amount of oxygen exceeding the stoichiometry, part of oxygen is easily released by heat treatment. The amount of released oxygen (the value converted into the number of oxygen atoms) obtained by TDS analysis when part of oxygen is easily released by heat treatment is greater than or equal to $1.0\times10^{18}$ atoms/cm$^3$, preferably greater than or equal to $1.0\times10^{20}$ atoms/cm$^3$, more preferably greater than or equal to $3.0\times10^{20}$ atoms/cm$^3$.

Here, a method for the TDS analysis is described. The amount of a gas released in the TDS analysis is proportional to a time integral value of ion intensity. Thus, the amount of a released gas can be calculated from the time integral value of the ion intensity of an oxide and a reference value of a standard sample. The reference value of a standard sample refers to the ratio of the density of atoms of a predetermined element contained in the sample to the integral value of its spectrum.

For example, the number of oxygen molecules ($O_2$) released from an oxide ($N_{O2}$) can be found according to the formula, $N_{O2}=N_{H2}/S_{H2}\times S_{O2}\times\alpha$, from the time integral value of the ion intensity of a silicon wafer containing hydrogen at a predetermined density (standard sample) and the time integral value of the ion intensity of the oxide.

$N_{H2}$ is the value obtained by conversion of the number of hydrogen molecules ($H_2$) released from the standard sample into density. $S_{H2}$ is the time integral value of the ion intensity of hydrogen molecules ($H_2$) of the standard sample. In other words, the reference value of the standard sample is $N_{H2}/S_{H2}$. $S_{O2}$ is the time integral value of the ion intensity of oxygen molecules ($O_2$) of the insulating oxide. $\alpha$ is a coefficient which influences the ion intensity. Refer to Japanese Published Patent Application No. H06-275697 for details of the above equation.

Note that the amount of oxygen released in the TDS analysis (the value converted into the number of oxygen atoms) is measured with a thermal desorption spectroscopy apparatus produced by ESCO Ltd., EMD-WA1000 S/W, using a silicon wafer containing hydrogen atoms at $1\times10^{16}$ atoms/cm$^3$ as the standard sample.

Note that, in the TDS analysis, oxygen is partly detected as oxygen atoms. The ratio between oxygen molecules and oxygen atoms can be calculated from the ionization rate of the oxygen molecules. Note that, since the above coefficient $\alpha$ includes the ionization rate of oxygen molecules, the number of the released oxygen atoms can also be calculated through the evaluation of the number of the released oxygen molecules.

Note that $N_{O2}$ is the number of released oxygen molecules ($O_2$). Therefore, the amount of released oxygen converted into the number of oxygen atoms is twice the number of the released oxygen molecules ($O_2$).

The interlayer insulating film 205 may be formed by a sputtering method, a CVD method, or the like and is preferably formed by a sputtering method. In the case where a silicon oxide film is formed as the interlayer insulating film 205, a quartz (preferably synthetic quartz) target may be used as a target, and an argon gas may be used as a sputtering gas. Alternatively, a silicon target may be used as a target, and a gas containing oxygen may be used as a sputtering gas. Note that the gas containing oxygen may be a mixed gas of an argon gas and an oxygen gas or may be an oxygen gas alone.

Between the formation of the interlayer insulating film 205 and the formation of an oxide semiconductor film to be the oxide semiconductor layer 211, first heat treatment is performed. The first heat treatment is performed to remove water and hydrogen contained in the interlayer insulating film 205. The temperature of the first heat treatment may be set higher than or equal to a temperature at which water and hydrogen contained in the interlayer insulating film 205 are released (a temperature at which the release amount peaks) and lower than a temperature at which the semiconductor substrate 200 provided with the p-channel transistor and the n-channel transistor alters or deforms, and is preferably set higher than or equal to 400° C. and lower than or equal to 750° C., and lower than a temperature of second heat treatment performed in a later step.

Then, the second heat treatment is performed after the oxide semiconductor film is formed. The second heat treatment is performed to supply oxygen to the oxide semiconductor film from the interlayer insulating film 205 which serves as a source of oxygen. Note that the timing of the second heat treatment is not limited thereto, and the second heat treatment may be performed after the oxide semiconductor film is processed into the oxide semiconductor layer 211.

Note that it is preferable that the second heat treatment be performed in a nitrogen gas atmosphere or a rare gas atmosphere including helium, neon, argon, or the like and the atmosphere do not contain hydrogen, water, a hydroxyl group, hydride, and the like. Alternatively, the purity of a nitrogen gas or a rare gas such as helium, neon, or argon introduced into a heat treatment apparatus is preferably set to 6N (99.9999%) or more, more preferably 7N (99.99999%) or more (i.e., the impurity concentration is 1 ppm or less, preferably 0.1 ppm or less).

In some cases, the oxide semiconductor film or the oxide semiconductor layer 211 may be crystallized into a microcrystalline oxide semiconductor layer or a polycrystalline oxide semiconductor layer, depending on the conditions of the second heat treatment or the material of the oxide semiconductor film or the oxide semiconductor layer 211. For example, the oxide semiconductor film or the oxide semiconductor layer 211 may be crystallized into a microcrystalline oxide semiconductor layer having a degree of crystallization of greater than or equal to 90%, or greater than or equal to 80%. Further, the oxide semiconductor film or the oxide semiconductor layer 211 may be an amorphous oxide semiconductor layer without containing a crystalline component, depending on the conditions of the second heat treatment or the material of the oxide semiconductor film or the oxide semiconductor layer 211. Furthermore, the oxide semiconductor film or the oxide semiconductor layer 211 may be an amorphous oxide semiconductor layer containing microcrystals (having a crystal grain size of 1 nm to 20 nm).

Note that in the second heat treatment, the interlayer insulating film 205 serves as a source of oxygen.

Note that the interlayer insulating film 205 over which the oxide semiconductor film is formed preferably has an average surface roughness ($R_a$) of greater than or equal to 0.1 nm and less than 0.5 nm. This is because crystal orientations can be aligned when the oxide semiconductor film is a crystalline oxide semiconductor film.

Note that the average surface roughness ($R_a$) is obtained by expanding the center line average roughness ($R_a$) that is defined by JIS B 0601:2001 (ISO 4287:1997) into three dimensions so as to be able to be applied to a measurement surface. The average surface roughness ($R_a$) is expressed as an average value of the absolute values of deviations from a reference surface to a specific surface.

Here, the center line average roughness ($R_a$) is shown by the following formula (1) assuming that a portion having a measurement length L is picked up from a roughness curve in the direction of the center line of the roughness curve, the direction of the center line of the roughness curve of the picked portion is represented by an X-axis, the direction of longitudinal magnification (direction perpendicular to the X-axis) is represented by a Y-axis, and the roughness curve is expressed as Y=F(X).

[Formula 1]

$$R_a = \frac{1}{L} \int_0^L |F(X)| dX \quad (1)$$

When the measurement surface which is a surface represented by measurement data is expressed as Z=F(X,Y), the average surface roughness ($R_a$) is an average value of the absolute values of deviations from the reference surface to the specific surface and is shown by the following formula (2).

[Formula 2]

$$R_a = \frac{1}{S_0} \int_{Y_1}^{Y_2} \int_{X_1}^{X_2} |F(X, Y) - Z_0| dX\, dY \quad (2)$$

Here, the specific surface is a surface which is an object of roughness measurement, and is a quadrilateral region which is surrounded by four points represented by the coordinates $(X_1, Y_1)$, $(X_1, Y_2)$, $(X_2, Y_1)$, and $(X_2, Y_2)$. $S_0$ represents the area of the specific surface when the specific surface is flat ideally.

In addition, the reference surface is a surface parallel to an X-Y plane at the average height of the specific surface. That is, when the average value of the height of the specific surface is expressed as $Z_0$, the height of the reference surface is also expressed as $Z_0$.

Chemical mechanical polishing (CMP) treatment may be performed so that the average surface roughness of the interlayer insulating film 205 can be greater than or equal to 0.1 nm and less than 0.5 nm. The CMP treatment may be performed before formation of the oxide semiconductor film, preferably before the first heat treatment.

The CMP treatment may be performed at least once. When the CMP treatment is performed plural times, it is preferable that first polishing be performed at a high polishing rate and final polishing be performed at a low polishing rate.

Instead of the CMP treatment, dry etching or the like may be performed in order to planarize the interlayer insulating film 205. As the etching gas, a chlorine-based gas such as a chlorine gas, a boron chloride gas, a silicon chloride gas, or a carbon tetrachloride gas, a fluorine-based gas such as a carbon tetrafluoride gas, a sulfur fluoride gas, or a nitrogen fluoride gas, or the like may be used.

Instead of the CMP treatment, plasma treatment or the like may be performed in order to planarize the interlayer insulating film 205. The plasma treatment may be performed here using a rare gas. In the plasma treatment, the surface to be processed is irradiated with ions of an inert gas and is planarized by a sputtering effect through removal of minute projections and depressions on the surface. Such plasma treatment is also referred to as "reverse sputtering".

Note that any of the above treatments may be employed in order to planarize the interlayer insulating film 205. For example, only reverse sputtering may be performed, or dry etching may be performed after CMP treatment is performed. Note that dry etching or reverse sputtering is preferably used so that water and the like can be prevented from entering the interlayer insulating film 205 over which the oxide semiconductor film is to be formed. In particular, in the case where the planarization treatment is performed after the first heat treatment, dry etching or reverse sputtering is preferably used.

The oxide semiconductor layer 211 may be selectively formed in such a manner that an oxide semiconductor film is formed, an etching mask is formed over the oxide semiconductor film, and etching is performed. Alternatively, an ink-jet method or the like may be used.

The oxide semiconductor film preferably contains at least indium (In) or zinc (Zn). In particular, both In and Zn are preferably contained. In addition, gallium (Ga) is preferably contained. When gallium (Ga) is contained, variation in the transistor characteristics can be reduced. Such an element capable of reducing variation in the transistor characteristics is referred to as a stabilizer. As a stabilizer, tin (Sn), hafnium (Hf), or aluminum (Al) can be given.

As another stabilizer, a lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) can be given. One or a plurality of these elements can be used.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as main components and there is no limitation on the ratio of In:Ga:Zn. Further, a metal element in addition to In, Ga, and Zn may be contained.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, the oxide semiconductor film which can be used in one embodiment of the present invention is not limited to those described above, and an oxide semiconductor film having an appropriate composition may be used depending on needed semiconductor characteristics (mobility, threshold voltage, variation, and the like). In accordance with needed transistor characteristics (semiconductor characteristics), the carrier density, the impurity concentration, the defect density, the atomic ratio between a metal element and oxygen, the interatomic distance, the density, and the like may be appropriately adjusted.

For example, with the In—Sn—Zn-based oxide, a relatively high mobility can be obtained. However, mobility can be increased by reducing the defect density in the bulk also in the case of using the In—Ga—Zn-based oxide.

The oxide semiconductor may be either single crystal or non-single-crystal. In the case where the oxide semiconductor is non-single-crystal, the oxide semiconductor may be either amorphous or polycrystalline. Further, the oxide semiconductor may have a structure including a crystalline portion in an amorphous portion. Moreover, the oxide semiconductor may be non-amorphous.

Note that the metal oxide preferably contains oxygen in excess of the stoichiometry. When excess oxygen is contained, generation of carriers due to oxygen deficiency in the oxide semiconductor film to be formed can be prevented.

Note that for example, in the case where the oxide semiconductor film is formed using an In—Zn-based metal oxide, a target has a composition ratio where In/Zn is 1 to 100, preferably 1 to 20, more preferably 1 to 10 in atomic ratio. When the atomic ratio of Zn is in the above preferred range, field-effect mobility can be improved. Here, when the atomic ratio of the metal oxide is In:Zn:O=X:Y:Z, it is preferable to satisfy the relation of $Z>1.5X+Y$ so that excess oxygen is contained.

Note that the filling factor of the target is greater than or equal to 90% and less than or equal to 100%, preferably greater than or equal to 95% and less than or equal to 99.9%. With a high filling factor, a dense oxide semiconductor film can be formed.

Note that the energy gap of a metal oxide which can be applied to the oxide semiconductor film is preferably 2 eV or more, more preferably 2.5 eV or more, still more preferably 3 eV or more. In this manner, the off-state current of a transistor can be reduced by using a metal oxide having a wide band gap.

Note that the oxide semiconductor film contains hydrogen. As hydrogen, a hydrogen atom, a hydrogen molecule, water, a hydroxyl group, or hydride may be contained in the oxide semiconductor film. It is preferable that hydrogen contained in the oxide semiconductor film be as little as possible.

Note that the concentrations of an alkali metal and an alkaline earth metal in the oxide semiconductor film are preferably low, and these concentrations are preferably $1\times10^{18}$ atoms/cm$^3$ or lower, more preferably $2\times10^{16}$ atoms/cm$^3$ or lower. This is because an alkali metal and an alkaline earth metal may be bonded to an oxide semiconductor to generate carriers, in which case the off-state current of the transistor is increased.

Note that there is no particular limitation on the formation method and the thickness of the oxide semiconductor film, which can be determined in consideration of the size or the like of a transistor to be manufactured. As an example of a method for forming the oxide semiconductor film, a sputtering method, a molecular beam epitaxy method, a coating method, a printing method, a pulsed laser deposition method, or the like can be given. The thickness of the oxide semiconductor film may be greater than or equal to 3 nm and less than or equal to 50 nm. This is because the transistor might be normally on when the oxide semiconductor film has a large thickness of 50 nm or more. In a transistor having a channel length of 30 μm, when the oxide semiconductor film has a thickness of 5 nm or less, a short-channel effect can be suppressed.

Here, as a preferable example, the oxide semiconductor film is formed by a sputtering method using an In—Ga—Zn-based metal oxide target. A rare gas (for example, an argon gas), an oxygen gas, or a mixed gas of a rare gas and an oxygen gas may be used as a sputtering gas.

It is preferable that a high-purity gas in which hydrogen, water, a hydroxyl group, or hydride is reduced be used as the sputtering gas for the formation of the oxide semiconductor film. In order to keep the high purity of a sputtering gas, a gas attached to the inner wall of a treatment chamber or the like is removed, and the semiconductor substrate 200 provided with the p-channel transistor and the n-channel transistor may be subjected to heat treatment before the oxide semiconductor film is formed. In addition, a high-purity sputtering gas may be introduced into the treatment chamber, which may be an argon gas having a purity of 9N (99.9999999%) or more, a dew point of −121° C. or less, a water content of 0.1 ppb or less, and a hydrogen content of 0.5 ppb or less or may be an oxygen gas having a purity of 8N (99.999999%) or less, a dew point of −112° C. or less, a water content of 1 ppb or less, and a hydrogen content of 1 ppb or less. When the oxide semiconductor film is formed while the semiconductor substrate 200 provided with the p-channel transistor and the n-channel transistor is being heated and kept at a high temperature, the concentration of impurities such as water contained in the oxide semiconductor film can be reduced. Furthermore, damage to the oxide semiconductor film by use of a sputtering method can be reduced. Here, the semiconductor substrate 200 provided with the p-channel transistor and the n-channel transistor may be kept at a temperature of higher than or equal to 100° C. and lower than or equal to 600° C., preferably higher than or equal to 200° C. and lower than or equal to 400° C.

In addition, oxygen may be supplied by ion implantation so that the oxide semiconductor film contains excess oxygen.

Note that the oxide semiconductor film may have an amorphous structure or a crystalline structure. In one embodiment in the case of having a crystalline structure, the oxide semiconductor film is preferably a c-axis aligned crystalline (CAAC) oxide semiconductor film. When the oxide semiconductor film is a CAAC oxide semiconductor film, the reliability of the transistor can be increased.

Note that the CAAC oxide semiconductor film means an oxide semiconductor film including a crystal which has c-axis alignment and a triangular or hexagonal atomic arrangement when seen from the direction of an a-b plane, a surface, or an interface. In the crystal, metal atoms are arranged in a layered manner, or metal atoms and oxygen atoms are arranged in a layered manner along the c-axis, and the direction of the a-axis or the b-axis is varied in the a-b plane (or the surface, or at the interface) (the crystal rotates around the c-axis).

Note that the CAAC oxide semiconductor film means, in a broad sense, a non-single-crystal oxide semiconductor film including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

Note that the CAAC oxide semiconductor film is not single crystal, but this does not mean that the CAAC oxide semiconductor film is composed of only an amorphous component. Although the CAAC oxide semiconductor film includes a crystallized portion (crystalline portion), a boundary between one crystalline portion and another crystalline portion is not clear in some cases.

Part of oxygen included in the CAAC oxide semiconductor film may be substituted with nitrogen. The c-axes of individual crystalline portions included in the CAAC oxide semiconductor film may be aligned in one direction (e.g., a direction perpendicular to a surface of a substrate over which the CAAC oxide semiconductor film is formed, a surface of the CAAC oxide semiconductor film, or an interface of the CAAC oxide semiconductor film). Alternatively, normals of the a-b planes of individual crystalline portions included in the CAAC oxide semiconductor film may be aligned in one direction (e.g., a direction perpendicular to the surface of the substrate over which the CAAC oxide semiconductor film is formed, the surface of the CAAC oxide semiconductor film, or the interface of the CAAC oxide semiconductor film).

Note that the CAAC oxide semiconductor film may be a conductor, a semiconductor, or an insulator depending on its composition or the like. The CAAC oxide semiconductor film transmits or does not transmit visible light depending on its composition or the like.

An example of such a CAAC oxide semiconductor film is a film formed using a material which has a triangular or hexagonal atomic arrangement when observed from the direction perpendicular to a surface of the film, a surface of a substrate, or an interface and in which metal atoms are arranged in a layered manner or metal atoms and oxygen atoms (or nitrogen atoms) are arranged in a layered manner when a cross section of the film is observed.

Examples of crystal structures included in such a CAAC oxide semiconductor film will be described in detail with reference to FIGS. 8A to 8E, FIGS. 9A to 9C, and FIGS. 10A to 10C. In FIGS. 8A to 8E, FIGS. 9A to 9C, and FIGS. 10A to 10C, the vertical direction basically corresponds to the c-axis direction and a plane perpendicular to the c-axis direction basically corresponds to the a-b plane. When the expression "an upper half" or "a lower half" is simply used, the boundary is the a-b plane. Furthermore, in FIGS. 8A to 8E, O surrounded by a circle represents a tetracoordinate O atom and O surrounded by a double circle represents a tricoordinate O atom.

Figure 8A:
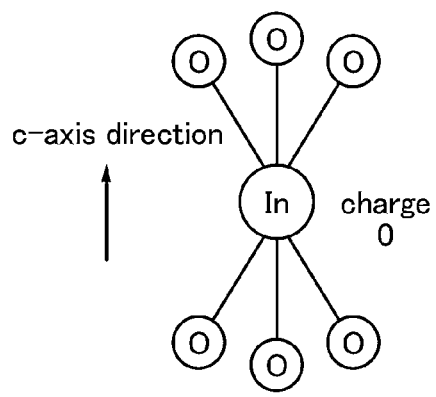
FIGS. 8A to 8E illustrate structures of oxide semiconductors which can be applied to a transistor.

FIG. 8A illustrates a structure including one hexacoordinate indium (hereinafter referred to as In) atom and six tetracoordinate oxygen (hereinafter referred to as tetracoordinate O) atoms proximate to the In atom. A structure in which one metal atom and oxygen atoms proximate to the In atom are only illustrated is called a subunit here. The structure in FIG. 8A is actually an octahedral structure, but is illustrated as a planar structure for simplicity. Note that three tetracoordinate O atoms exist in each of an upper half and a lower half in FIG. 8A. In the subunit illustrated in FIG. 8A, electric charge is 0.

Figure 8D:
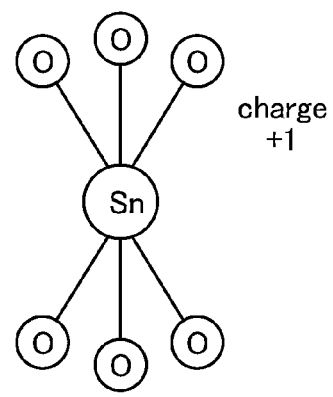
Figure 8B:
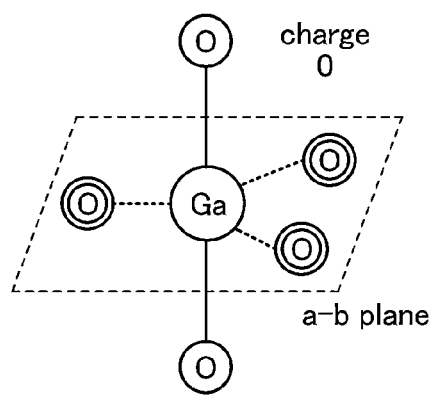

FIG. 8B illustrates a structure including one pentacoordinate gallium (hereinafter referred to as Ga) atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 8B. An In atom can also have the structure illustrated in FIG. 8B because an In atom can have five ligands. In the subunit illustrated in FIG. 8B, electric charge is 0.

Figure 8E:
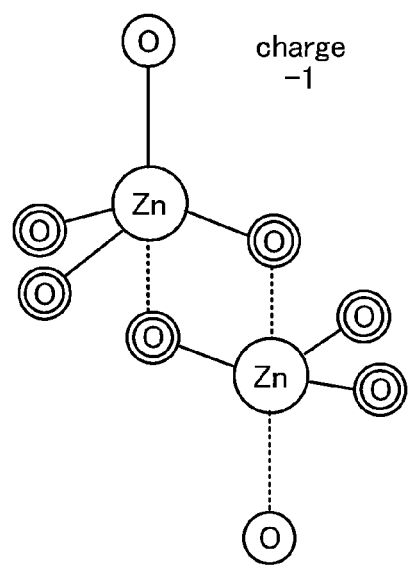
Figure 8C:
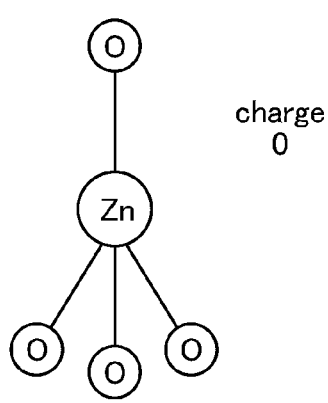

FIG. 8C illustrates a structure including one tetracoordinate zinc (hereinafter referred to as Zn) atom and four tetracoordinate O atoms proximate to the Zn atom. In FIG. 8C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 8C. In the subunit illustrated in FIG. 8C, electric charge is 0.

FIG. 8D illustrates a structure including one hexacoordinate tin (hereinafter referred to as Sn) atom and six tetracoordinate O atoms proximate to the Sn atom. In FIG. 8D, three tetracoordinate O atoms exist in each of an upper half and a lower half. In the subunit illustrated in FIG. 8D, electric charge is +1.

FIG. 8E illustrates a subunit including two Zn atoms. In FIG. 8E, one tetracoordinate O atom exists in each of an upper half and a lower half. In the subunit illustrated in FIG. 8E, electric charge is −1.

Here, a plurality of subunits forms one group, and a plurality of groups forms one cycle which is called a unit.

Now, a rule of bonding between the subunits will be described. The three O atoms in the upper half with respect to the hexacoordinate In atom in FIG. 8A each have three proximate In atoms in the downward direction, and the three O atoms in the lower half each have three proximate In atoms in the upward direction. The one O atom in the upper half with respect to the pentacoordinate Ga atom in FIG. 8B has one proximate Ga atom in the downward direction, and the one O atom in the lower half has one proximate Ga atom in the upward direction. The one O atom in the upper half with respect to the tetracoordinate Zn atom in FIG. 8C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of subunits including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, one group can be formed in a different manner by combining a plurality of subunits so that the total electric charge of the layered structure is 0.

Figure 9A:
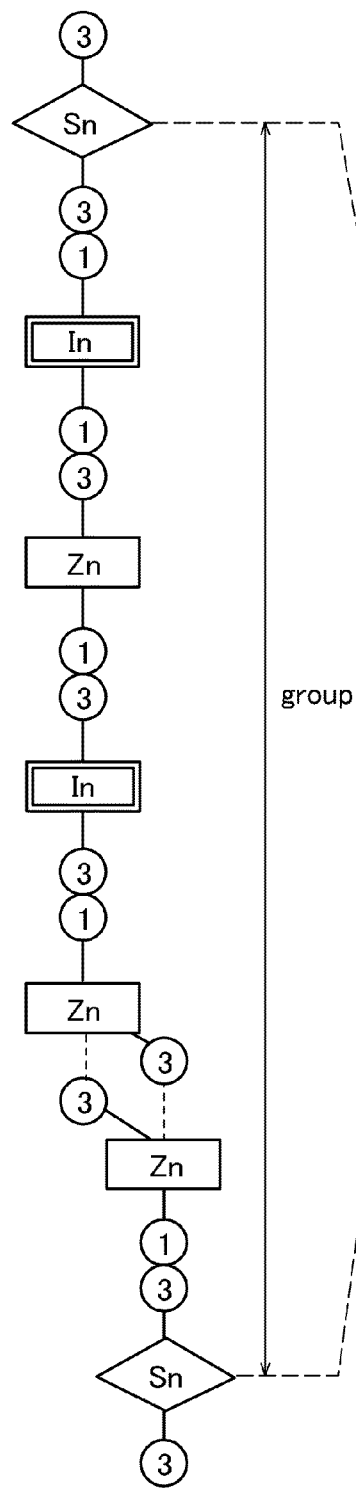
FIGS. 9A to 9C illustrate a structure of an oxide semiconductor which can be applied to a transistor.
Figure 9B:
Figure 9C:
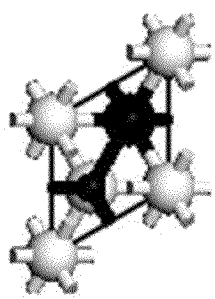

FIG. 9A illustrates a model of one group included in a layered structure of an In—Sn—Zn-based metal oxide. FIG. 9B illustrates a unit including three groups. Note that FIG. 9C illustrates an atomic arrangement in the case where the layered structure in FIG. 9B is observed from the c-axis direction.

In FIG. 9A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 9A, one tetracoordinate O atom existing in each of an upper half and a lower half with respect to an In atom is denoted by circled 1. Similarly, FIG. 9A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the group included in the layered structure of the In—Sn—Zn-based metal oxide in FIG. 9A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a subunit that includes two Zn atoms and is proximate to one tetracoordinate O atom in an upper half, and the subunit is bonded to a Sn atom proximate to three tetracoordinate O atoms in each of an upper half and a lower half through one tetracoordinate O atom in a lower half with respect to the subunit. A plurality of such groups is bonded to form one unit that corresponds to one cycle.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Thus, electric charge of a subunit including a Sn atom is +1. Accordingly, electric charge of −1, which cancels +1, is needed to form a layered structure including a Sn atom. As a structure having electric charge of −1, the subunit including two Zn atoms as illustrated in FIG. 8E can be given. For example, with one subunit including two Zn atoms, electric charge of one subunit including a Sn atom can be cancelled, so that the total electric charge of the layered structure can be 0.

An In atom can have either five ligands or six ligands. Specifically, using the unit illustrated in FIG. 9B, In—Sn—Zn-based metal oxide crystal ($In_2SnZn_3O_g$) can be obtained. Note that a layered structure of the obtained In—Sn—Zn-based metal oxide crystal can be expressed by a composition formula, $In_2SnZn_2O_7(ZnO)_m$ (m is 0 or a natural number).

The above-described rule also applies to other metal oxides. As an example, FIG. 10A illustrates a model of a group included in a layered structure of In—Ga—Zn-based metal oxide crystal.

Figure 10A:
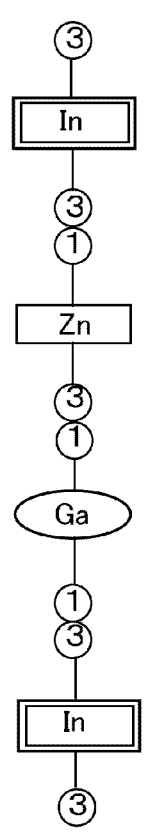
FIGS. 10A to 10C illustrate a structure of an oxide semiconductor which can be applied to a transistor.

In the group included in the layered structure of the In—Ga—Zn-based metal oxide crystal in FIG. 10A, in the order starting from the top, an In atom proximate to three tetracoordinate O atoms in each of an upper half and a lower half is bonded to one tetracoordinate O atom in an upper half of a Zn atom, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such groups is bonded to form a unit that corresponds to one cycle.

Figure 10B:
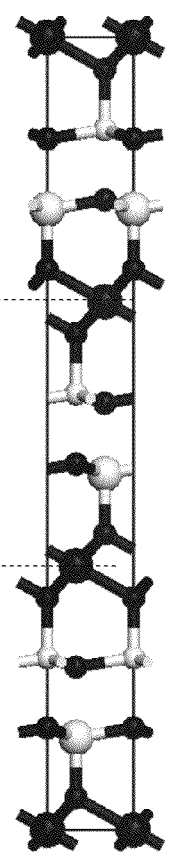
Figure 10C:
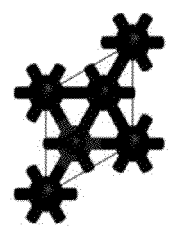

FIG. 10B illustrates a unit including three groups. Note that FIG. 10C illustrates an arrangement of atoms in the case where the layered structure in FIG. 10B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a subunit including any of an In atom, a Zn atom, and a Ga atom is 0. As a result, the total electric charge of a group having a combination of such subunits is always 0.

Note that the group included in the layered structure of the In—Ga—Zn-based metal oxide crystal is not limited to the group illustrated in FIG. 10A.

Here, a method for forming the CAAC oxide semiconductor film is described.

First, an oxide semiconductor film is formed by a sputtering method or the like. Note that by forming the oxide semiconductor film while keeping the semiconductor substrate 200 provided with the p-channel transistor and the n-channel transistor at high temperature, the ratio of a crystalline portion to an amorphous portion can be high. At this time, the temperature of the semiconductor substrate 200 provided with the p-channel transistor and the n-channel transistor may be, for example, higher than or equal to 150° C. and lower than or equal to 450° C., preferably higher than or equal to 200° C. and lower than or equal to 350° C.

Here, the formed oxide semiconductor film may be subjected to a heat treatment. By the heat treatment, the ratio of a crystalline portion to an amorphous portion can be high. In the heat treatment, the temperature of the semiconductor substrate 200 provided with the p-channel transistor and the n-channel transistor is, for example, higher than or equal to 200° C. and lower than a temperature at which the semiconductor substrate 200 provided with the p-channel transistor and the n-channel transistor alters or deforms, preferably higher than or equal to 250° C. and lower than or equal to 450° C. The heat treatment may be performed for 3 minutes or longer, and preferably 24 hours or shorter. This is because the productivity is decreased when the heat treatment is performed for a long time, although the ratio of a crystalline portion to an amorphous portion can be high. Note that the heat treatment may be performed in an oxidizing atmosphere or an inert atmosphere; however, there is no limitation thereto. This heat treatment may be performed under a reduced pressure.

The oxidizing atmosphere is an atmosphere containing an oxidizing gas. As examples of the oxidizing gas, oxygen, ozone, nitrous oxide, and the like can be given. It is preferable that components (e.g., water and hydrogen) which are not preferably contained in the oxide semiconductor film be removed from the oxidizing atmosphere as much as possible. For example, the purity of oxygen, ozone, or nitrous oxide may be higher than or equal to 8N (99.999999%), more preferably higher than or equal to 9N (99.9999999%).

The oxidizing atmosphere may contain an inert gas such as a rare gas. Note that the oxidizing atmosphere contains an oxidizing gas at a concentration of higher than or equal to 10 ppm. An inert atmosphere contains an inert gas (a nitrogen gas, a rare gas, or the like) and contains a reactive gas such as an oxidizing gas at a concentration of lower than 10 ppm.

Note that a rapid thermal annealing (RTA) apparatus may be used for all the heat treatments. With the use of the RTA apparatus, the heat treatment can be performed at high temperature if the heating time is short. Thus, the oxide semiconductor film having a high ratio of a crystalline portion to an amorphous portion can be formed, and a decrease in productivity can be suppressed.

However, the apparatus used for all the heat treatments is not limited to an RTA apparatus; for example, an apparatus provided with a unit that heats an object to be processed by thermal conduction or thermal radiation from a resistance heater or the like may be used. For example, an electric furnace or a rapid thermal annealing (RTA) apparatus such as a gas rapid thermal annealing (GRTA) apparatus or a lamp rapid thermal annealing (LRTA) apparatus can be given as the heat treatment apparatus used for all the heat treatments. Note that an LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heating an object to be processed using a high-temperature gas as a heat medium. Here, the temperature of the high-temperature gas is preferably higher than the heat temperature of the object to be processed.

With the use of an In—Ga—Zn-based metal oxide in which the nitrogen concentration is higher than or equal to $1 \times 10^{17}$ atoms/cm$^3$ and lower than or equal to $5 \times 10^{19}$ atoms/cm$^3$, a metal oxide film having a c-axis-aligned hexagonal crystal structure is formed and one or more layers containing Ga and Zn are provided between two layers of the In—O crystal planes (crystal planes containing indium and oxygen).

In order to form an In—Sn—Zn-based metal oxide, a target of In:Sn:Zn=1:2:2, 2:1:3, 1:1:1, or 20:45:35 in atomic ratio may be used, for example.

As described above, the CAAC oxide semiconductor film can be formed.

The CAAC oxide semiconductor film has high orderliness of a bond between metal and oxygen as compared to an oxide semiconductor film having an amorphous structure. In other words, in the case of an oxide semiconductor film having an amorphous structure, the number of oxygen atoms coordinated around an adjacent metal atom varies according to the kind of the adjacent metal atom. In contrast, in the case of the CAAC oxide semiconductor film, the number of oxygen atoms coordinated around an adjacent metal atom is substantially the same. Therefore, oxygen deficiency is hardly observed even at a microscopic level, and charge transfer and instability of electric conductivity due to hydrogen atoms (including hydrogen ions), alkali metal atoms, or the like can be suppressed.

Therefore, when a transistor has a channel formation region formed using a CAAC oxide semiconductor film, it is possible to suppress the shift of the threshold voltage of the transistor which occurs through light irradiation or a bias-temperature stress (BT) test on the transistor, so that the transistor can have stable electrical characteristics.

Next, an etching mask is formed over the oxide semiconductor film and etching is performed, whereby the oxide semiconductor layer 211 is formed (FIG. 7A).

Then, the source electrode 212a and the drain electrode 212b which are apart from each other are formed in contact with the oxide semiconductor layer 211 (FIG. 7B).

The source electrode 212a and the drain electrode 212b may be selectively formed in such a manner that, for example, a conductive film (e.g., a metal film or a silicon film to which an impurity element imparting one conductivity type is added) is formed by a sputtering method, an etching mask is formed over the conductive film, and etching is performed. Alternatively, an ink-jet method may be used. Note that the conductive film to be the source electrode 212a and the drain electrode 212b may be formed by using a single layer or by stacking a plurality of layers. For example, the conductive film may be formed to have a three-layer structure in which an Al layer is sandwiched between Ti layers.

Next, the gate insulating film 213 is formed over at least the channel formation region of the oxide semiconductor layer 211, and after the gate insulating film 213 is formed, an opening is formed (FIG. 7C). The opening is formed so as to overlap with the gate electrode 204.

As the gate insulating film 213, for example, a film of an insulating material (for example, silicon nitride, silicon nitride oxide, silicon oxynitride, silicon oxide, or the like) may be formed using a sputtering method. Note that the gate insulating film 213 may be formed by using a single layer or by stacking a plurality of layers. Here, the gate insulating film 213 is formed to have a two-layer structure in which a silicon oxynitride layer is stacked over a silicon nitride layer, for example. Note that in the case where the gate insulating film 213 is formed by a sputtering method, hydrogen and moisture can be prevented from entering the oxide semiconductor layer 211. In addition, the gate insulating film 213 is preferably an insulating oxide film because oxygen can be supplied to fill oxygen vacancies.

Note that "silicon nitride oxide" contains more nitrogen than oxygen. Further, "silicon oxynitride" contains more oxygen than nitrogen.

Here, the oxide semiconductor film may be processed by dry etching. For example, a chlorine gas or a mixed gas of a boron trichloride gas and a chlorine gas may be used as an etching gas used for the dry etching. However, there is no limitation thereto; wet etching may be used or another method capable of processing the oxide semiconductor film may be used.

The gate insulating film 213 contains oxygen at least in a portion in contact with the oxide semiconductor layer 211 and is preferably formed using an insulating oxide from which part of oxygen is released by heating. In other words, the materials given as examples of the material of the interlayer insulating film 205 are preferably used. When the portion of the gate insulating film 213 which is in contact with the oxide semiconductor layer 211 is formed using silicon oxide, oxygen can be diffused into the oxide semiconductor layer 211 and a reduction in the resistance of the transistor can be prevented.

Note that the gate insulating film 213 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, yttrium oxide, or lanthanum oxide so that gate leakage current can be reduced. Here, gate leakage current refers to leakage current which flows between a gate electrode and a source or drain electrode. Further, a layer formed using the high-k material and a layer formed using silicon oxide, silicon oxynitride, silicon nitride, silicon nitride oxide, aluminum oxide, aluminum oxynitride, or gallium oxide may be stacked. Note that even in the case where the gate insulating film 213 has a stacked structure, the portion in contact with the oxide semiconductor layer 211 is preferably formed using an insulating oxide.

The gate insulating film 213 may be formed by a sputtering method. The thickness of the gate insulating film 213 may be greater than or equal to 1 nm and less than or equal to 300 nm, preferably greater than or equal to 5 nm and less than or equal to 50 nm. When the thickness of the gate insulating film 213 is greater than or equal to 5 nm, gate leakage current can be particularly reduced.

In addition, third heat treatment (preferably at a temperature of higher than or equal to 200° C. and lower than or equal to 400° C., for example, at a temperature of higher than or equal to 250° C. and lower than or equal to 350° C.) may be performed in an inert gas atmosphere or an oxygen gas atmosphere. By the third heat treatment, hydrogen or moisture remaining in the oxide semiconductor layer 211 can be diffused into the gate insulating film. Furthermore, by the third heat treatment, oxygen can be supplied to the oxide semiconductor layer 211 from the gate insulating film 213 which serves as a source of oxygen.

The third heat treatment may be performed not only after the gate insulating film 213 is formed over the oxide semiconductor layer 211 but also after the electrode 214a and the gate electrode 214b are formed or the conductive film to be the electrode 214a and the gate electrode 214b is formed.

Note that the concentration of hydrogen in the oxide semiconductor layer 211 is preferably $5.0 \times 10^{19}$ atoms/cm$^3$ or lower, more preferably $5.0 \times 10^{18}$ atoms/cm$^3$ or lower. When the concentration of hydrogen is low as mentioned above, the threshold voltage of the transistor can be prevented from shifting in the negative direction.

Note that the oxide semiconductor layer 211 preferably has a low carrier concentration of lower than $1.0 \times 10^{14}$/cm$^3$. When the carrier concentration is low, off-state current can be low.

Next, a conductive film is formed over the gate insulating film 213, an etching mask is formed over the conductive film, and etching is performed, whereby the electrode 214a and the gate electrode 214b are formed (FIG. 7D).

The electrode 214a and the gate electrode 214b may be formed using a material and a method which are similar to those for the source electrode 212a and the drain electrode 212b.

Although not illustrated, it is preferable that a dopant be added to the oxide semiconductor layer 211 using the gate electrode 214b as a mask to form a source region and a drain region in the oxide semiconductor layer 211.

Note that here, the dopant may be added by an ion implantation method or an ion doping method. Alternatively, the dopant may be added by performing plasma treatment in an atmosphere of a gas containing the dopant. As the dopant, nitrogen, phosphorus, boron, or the like may be added.

In the above-described manner, an oxide semiconductor transistor can be manufactured over a transistor formed using a semiconductor substrate as illustrated in FIG. 6.

As described above, an oxide semiconductor is preferably used for the oxide semiconductor transistor. A transistor including an oxide semiconductor can have high field-effect mobility.

Note that the actual field-effect mobility of the transistor including an oxide semiconductor can be lower than its original mobility. One of the causes for the lower mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed by the following formula (3).

[Formula 3]

$$\mu = \mu_0 \exp\left(-\frac{E}{kT}\right) \quad (3)$$

Here, E represents the height of the potential barrier, k represents the Boltzmann constant, and T represents the absolute temperature. When the potential barrier is assumed to be attributed to a defect, the height of the potential barrier can be expressed by the following formula (4) according to the Levinson model.

[Formula 4]

$$E = \frac{e^2 N^2}{8\varepsilon n} = \frac{e^3 N^2 t}{8\varepsilon C_{ox} V_g} \qquad (4)$$

Here, e represents the elementary charge, N represents the average defect density per unit area in a channel, ∈ represents the dielectric constant of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer.

The drain current $I_d$ in a linear region can be expressed by the following formula (5).

[Formula 5]

$$I_d = \frac{W \mu V_g V_d C_{ox}}{L} \exp\left(-\frac{E}{kT}\right) \qquad (5)$$

Here, L represents the channel length and W represents the channel width, and L and W are each 10 μm. In addition, $V_d$ represents the drain voltage. When dividing both sides of the formula (5) by $V_g$ and then taking logarithms of both sides, the following formula (6) can be obtained.

[Formula 6]

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8 k T \varepsilon C_{ox} V_g} \qquad (6)$$

The right side of the formula (6) is a function of $V_g$. From the formula (6), it is found that the defect density N can be obtained from the slope of a line in a graph which is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In) to tin (Sn) and zinc (Zn) is 1:1:1 is approximately $1 \times 10^{12}/cm^2$.

On the basis of the defect density obtained in this manner, or the like, $\mu_0$ can be calculated to be 120 cm²/Vs from the formula (3) and the formula (4). The measured mobility of an In—Sn—Zn oxide including a defect is approximately 40 cm²/Vs. However, assuming that no defect exists inside the semiconductor and at the interface between the semiconductor and an insulating film, it is found from the above results that the mobility $\mu_0$ of the oxide semiconductor is 120 cm²/Vs.

Note that even when no defect exists inside a semiconductor, scattering at an interface between a channel and a gate insulating film affects the transport property of the transistor. In other words, the field-effect mobility $\mu_1$ at a position that is distance x away from the interface between the channel and the gate insulating film can be expressed by the following formula (7).

[Formula 7]

$$\frac{1}{\mu_1} = \frac{1}{\mu_0} + \frac{D}{B} \exp\left(-\frac{x}{l}\right) \qquad (7)$$

Here, D represents the electric field in the gate direction, and B and l are constants. B and l can be obtained from actual measurement results; according to the above measurement results, B is $4.75 \times 10^7$ cm/s and l is 10 nm (the depth to which the influence of interface scattering reaches). When D is increased (i.e., when the gate voltage is increased), the second term of the formula (7) is increased and accordingly the field-effect mobility $\mu_1$ is decreased.

Figure 11:
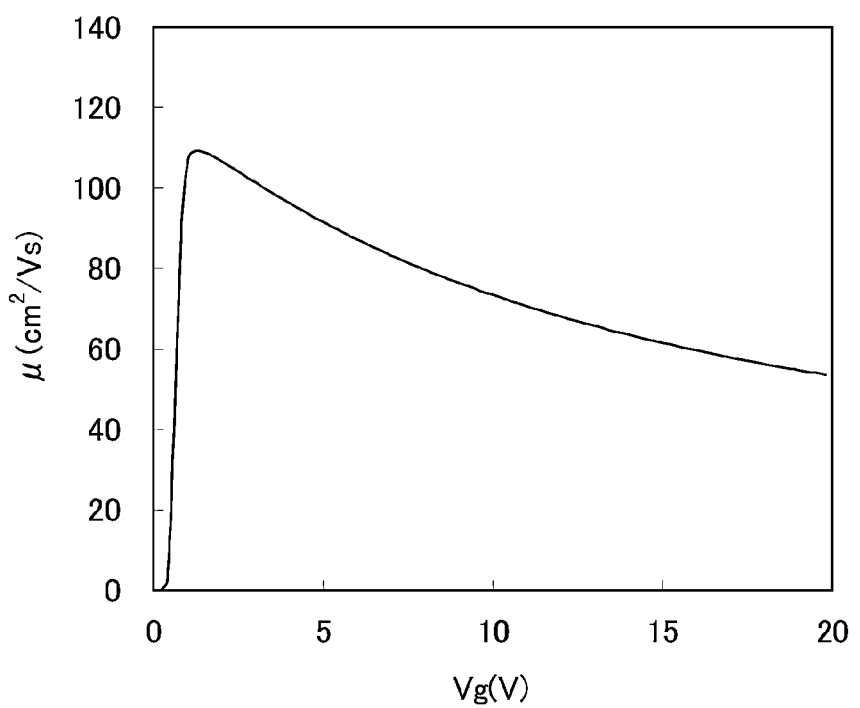
FIG. 11 shows gate voltage dependence of field-effect mobility obtained by calculation.

Calculation results of the field-effect mobility $\mu_2$ of a transistor whose channel includes an ideal oxide semiconductor without a defect inside the semiconductor are shown in FIG. 11. For the calculation, device simulation software Sentaurus Device (manufactured by Synopsys, Inc.) was used, and the bandgap, the electron affinity, the relative permittivity, and the thickness of the oxide semiconductor were assumed to be 2.8 eV, 4.7 eV, 15, and 15 nm, respectively. Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 11, the mobility has a peak of more than or equal to 100 cm²/Vs at a gate voltage that is a little over 1 V and is decreased as the gate voltage becomes higher because the influence of interface scattering is increased. Note that in order to reduce interface scattering, it is preferable that a surface of the semiconductor layer be flat at the atomic level (atomic layer flatness), as described with the above formula (1) and the like.

Calculation results of characteristics of minute transistors which are manufactured using an oxide semiconductor having such a mobility are shown in FIGS. 12A to 12C, FIGS. 13A to 13C, and FIGS. 14A to 14C. FIGS. 15A and 15B illustrate cross-sectional structures of the transistors used for the calculation. The transistors illustrated in FIGS. 15A and 15B each include a semiconductor region 303a and a semiconductor region 303c which have n⁺-type conductivity in an oxide semiconductor layer. In the calculation, the resistivity of the semiconductor region 303a and the semiconductor region 303c was assumed to be $2 \times 10^{-3}$ Ωcm.

The transistor illustrated in FIG. 15A includes a base insulating film 301, an embedded insulating film 302 which is embedded in the base insulating film 301 and formed of aluminum oxide, the semiconductor region 303a, the semiconductor region 303c, an intrinsic semiconductor region 303b serving as a channel formation region therebetween, and a gate 305. In the calculation, the width of the gate 305 was assumed to be 33 nm.

A gate insulating film 304 is formed between the gate 305 and the semiconductor region 303b. In addition, a sidewall insulator 306a and a sidewall insulator 306b are formed on both side surfaces of the gate 305, and an insulating film 307 is formed over the gate 305 so as to prevent a short circuit between the gate 305 and another wiring. The width of the sidewall insulator was assumed to be 5 nm. A source 308a and a drain 308b are provided in contact with the semiconductor region 303a and the semiconductor region 303c, respectively. Note that the channel width of this transistor is 40 nm.

The transistor illustrated in FIG. 15B includes the base insulating film 301, the embedded insulating film 302 formed of aluminum oxide, the semiconductor region 303*a*, the semiconductor region 303*c*, the intrinsic semiconductor region 303*b* serving as a channel formation region therebetween, the gate insulating film 304, the gate 305, the sidewall insulator 306*a* and the sidewall insulator 306*b*, the insulating film 307, the source 308*a*, and the drain 308*b*.

The transistor illustrated in FIG. 15A is different from the transistor illustrated in FIG. 15B in the conductivity type of semiconductor regions directly below the sidewall insulator 306*a* and the sidewall insulator 306*b*. The semiconductor regions directly below the sidewall insulator 306*a* and the sidewall insulator 306*b* are regions having $n^+$-type conductivity in the transistor illustrated in FIG. 15A, and are intrinsic semiconductor regions in the transistor illustrated in FIG. 15B. In other words, in the semiconductor layer of FIG. 15B, a region having a width of $L_{off}$ which overlaps with neither the semiconductor region 303*a* (the semiconductor region 303*c*) nor the gate 305 is provided. This region is called an offset region, and the width $L_{off}$ is called an offset length. The offset length is equal to the width of the sidewall insulator 306*a* (the sidewall insulator 306*b*).

Figure 12A:
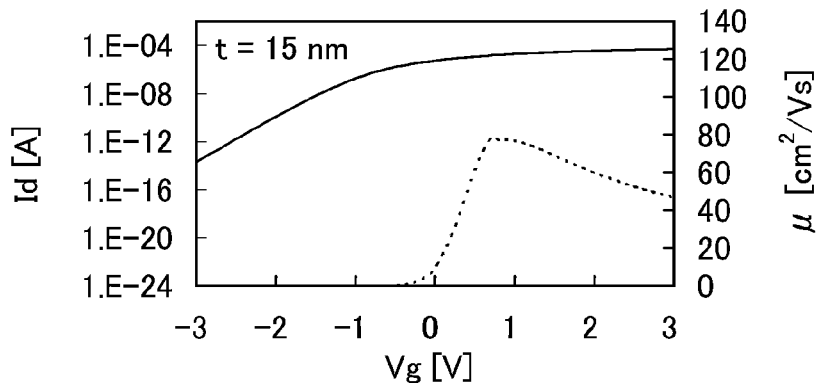
FIGS. 12A to 12C show gate voltage dependence of drain current and field-effect mobility obtained by calculation.
Figure 12B:
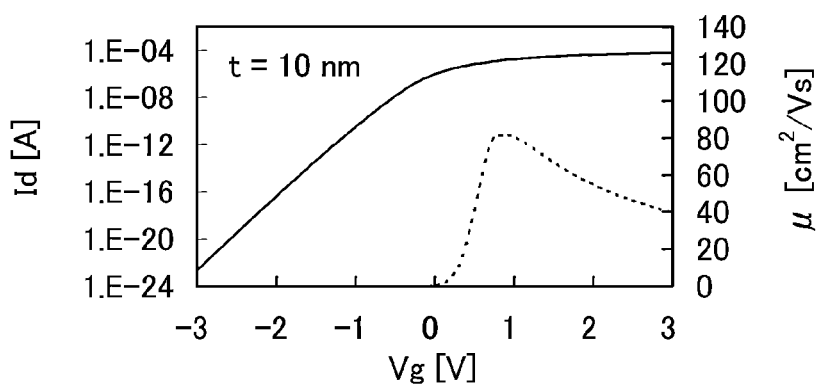
Figure 12C:
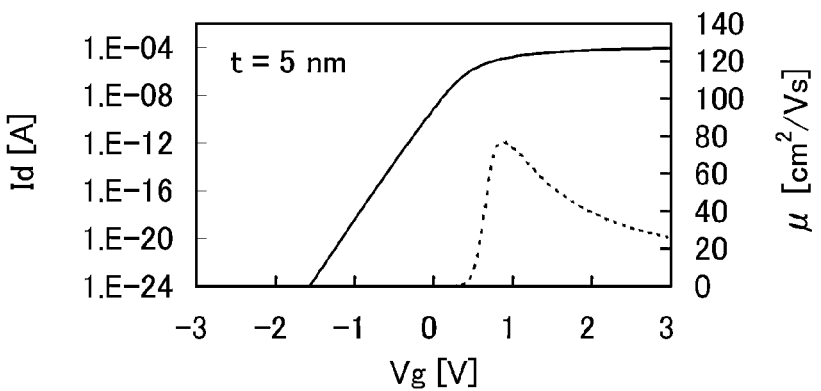

The other parameters used in calculation are as described above. For the calculation, device simulation software Sentaurus Device manufactured by Synopsys, Inc. was used. FIGS. 12A to 12C show the gate voltage ($V_g$: a potential difference obtained by subtracting the potential of the source from that of the gate) dependence of the drain current ($I_d$, a solid line) and the field-effect mobility ($\mu$, a dotted line) of the transistor having the structure illustrated in FIG. 15A. The drain current $I_d$ is obtained by calculation under the assumption that the drain voltage ($V_d$: a potential difference obtained by subtracting the potential of the source from that of the drain) is +1 V and the mobility $\mu$ is obtained by calculation under the assumption that the drain voltage is +0.1 V.

The thickness of the gate insulating film is 15 nm in FIG. 12A, 10 nm in FIG. 12B, and 5 nm in FIG. 12C. As the gate insulating film is thinner, the drain current $I_d$ (off-state current) particularly in an off state is significantly decreased. In contrast, there is no noticeable change in the peak value of the field-effect mobility $\mu$ and the drain current $I_d$ (on-state current) in an on state.

Figure 13A:
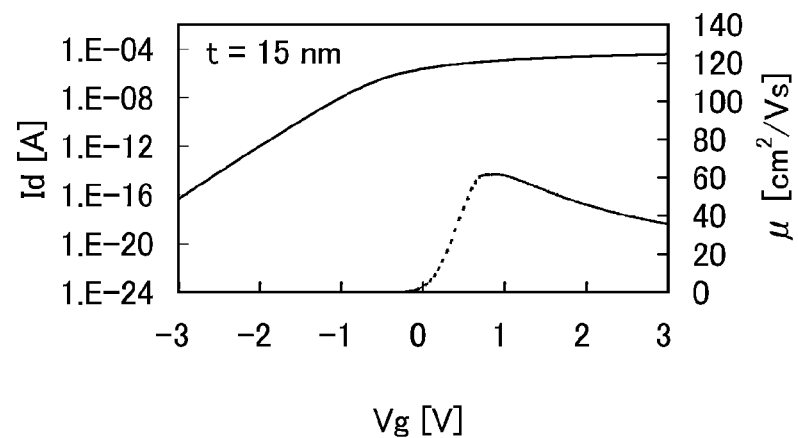
FIGS. 13A to 13C show gate voltage dependence of drain current and field-effect mobility obtained by calculation.
Figure 13B:
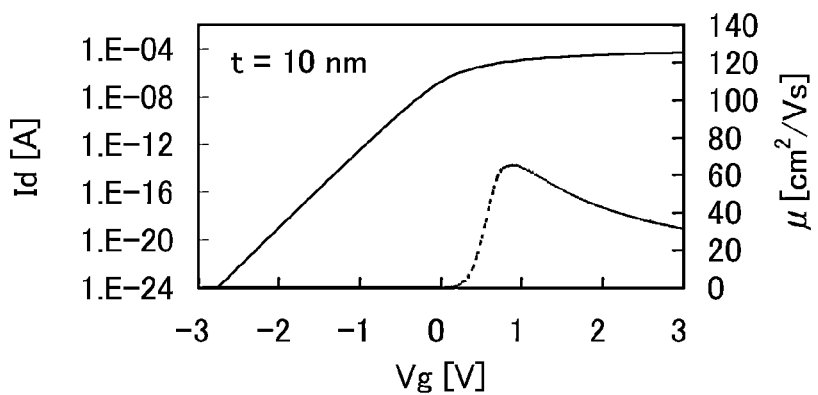
Figure 13C:
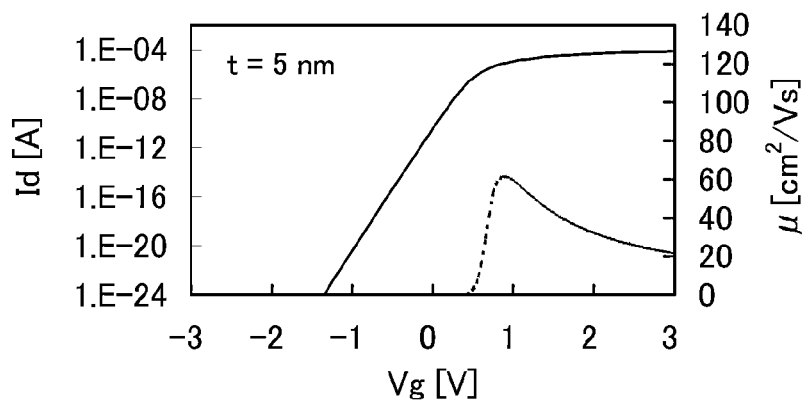

FIGS. 13A to 13C show the gate voltage $V_g$ dependence of the drain current $I_d$ (a solid line) and the field-effect mobility $\mu$ (a dotted line) of the transistor illustrated in FIG. 15B where the offset length $L_{off}$ is 5 nm. The drain current $I_d$ is obtained by calculation under the assumption that the drain voltage is +1 V and the field-effect mobility $\mu$ is obtained by calculation under the assumption that the drain voltage is +0.1 V. The thickness of the gate insulating film is 15 nm in FIG. 13A, 10 nm in FIG. 13B, and 5 nm in FIG. 13C.

Figure 14A:
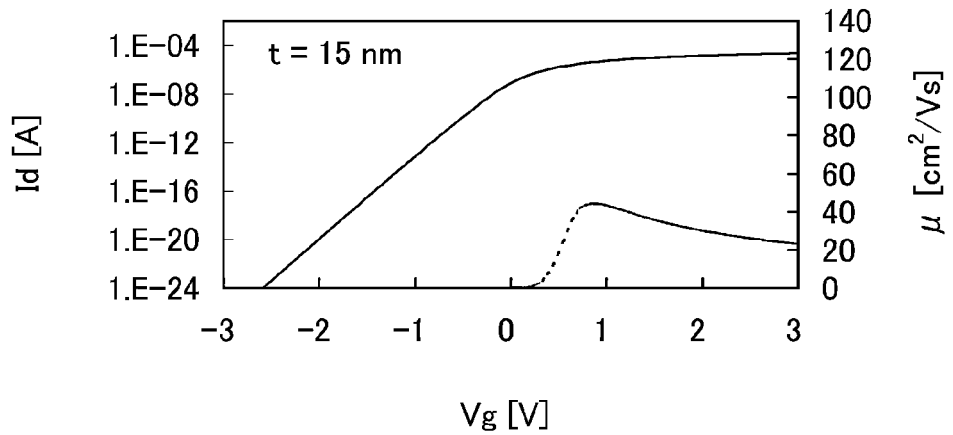
FIGS. 14A to 14C show gate voltage dependence of drain current and field-effect mobility obtained by calculation.
Figure 14B:
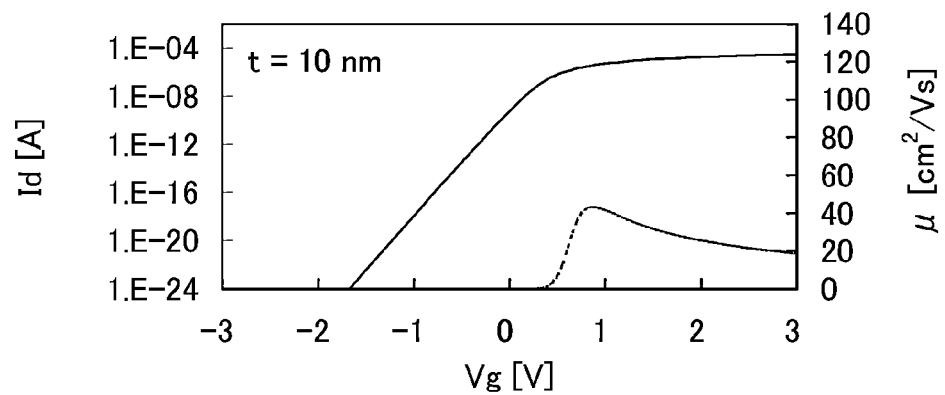
Figure 14C:
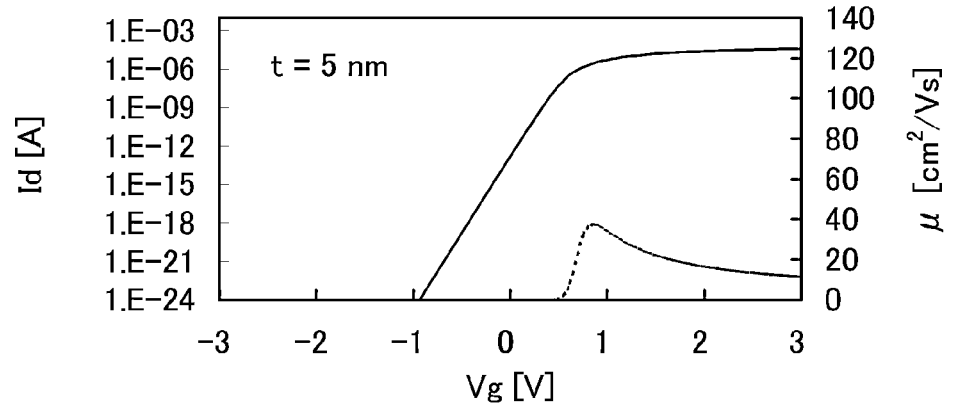
Figure 15A:
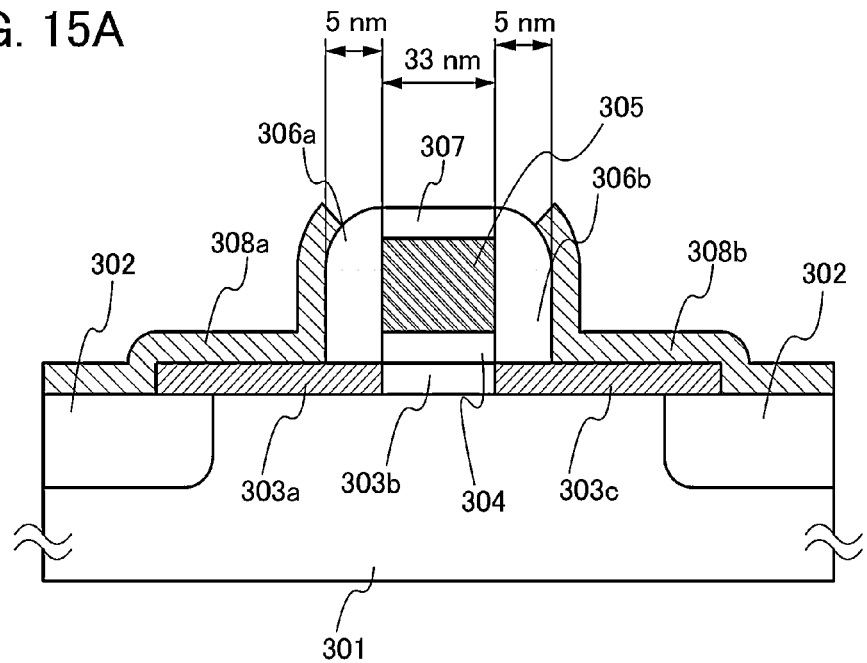
FIGS. 15A and 15B illustrate cross-sectional structures of transistors used for calculation.
Figure 15B:
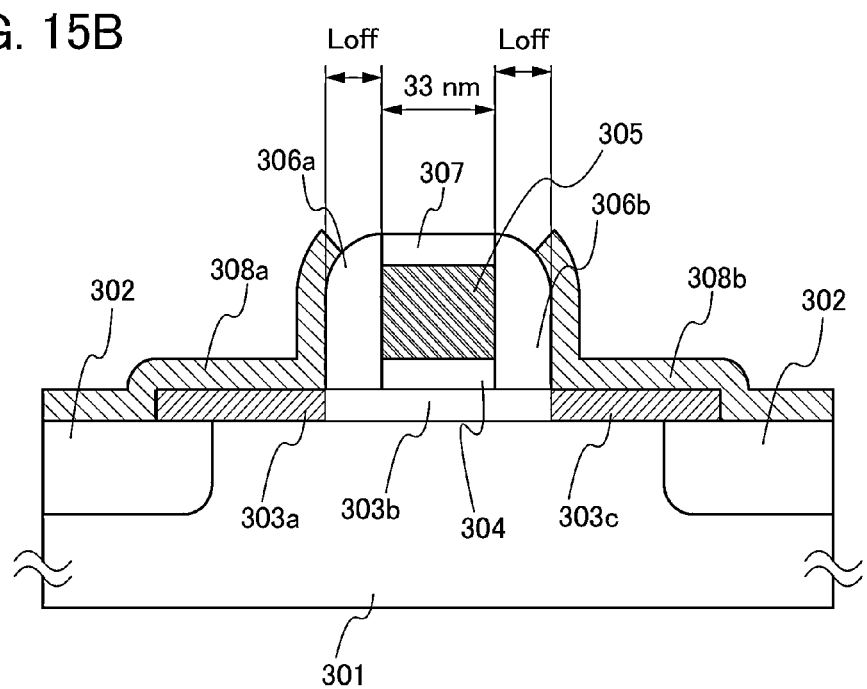

FIGS. 14A to 14C show the gate voltage $V_g$ dependence of the drain current $I_d$ (a solid line) and the mobility $\mu$ (a dotted line) of the transistor illustrated in FIG. 15B where the offset length $L_{off}$ is 15 nm. The drain current $I_d$ is obtained by calculation under the assumption that the drain voltage is +1 V and the field-effect mobility $\mu$ is obtained by calculation under the assumption that the drain voltage is +0.1 V. The thickness of the gate insulating film is 15 nm in FIG. 14A, 10 nm in FIG. 14B, and 5 nm in FIG. 14C.

In either of the structures, as the gate insulating film is thinner, the off-state current is significantly decreased, whereas no noticeable change arises in the peak value of the field-effect mobility $\mu$ and the on-state current.

Note that the peak of the field-effect mobility $\mu$ is approximately 80 $cm^2$/Vs in FIGS. 12A to 12C, approximately 60 $cm^2$/Vs in FIGS. 13A to 13C, and approximately 40 $cm^2$/VS in FIGS. 14A to 14C; thus, the peak of the mobility $\mu$ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current.

As described above, the oxide semiconductor transistor including an oxide semiconductor can have significantly high field-effect mobility.

Note that the transistor described in this embodiment as an oxide semiconductor transistor is a mere example, and without limitation thereto, various modes can be employed for the oxide semiconductor transistor.

A transistor in which an oxide semiconductor containing In, Sn, and Zn as main components is used as a channel formation region can have favorable characteristics by depositing the oxide semiconductor while heating a substrate or by performing heat treatment after forming an oxide semiconductor film. Note that a main component refers to an element included in a composition at 5 atomic % or more.

By intentionally heating the substrate after formation of the oxide semiconductor film containing In, Sn, and Zn as main components, the field-effect mobility of the transistor can be improved. Further, the threshold voltage of the transistor can be positively shifted to make the transistor normally off.

Figure 16A:
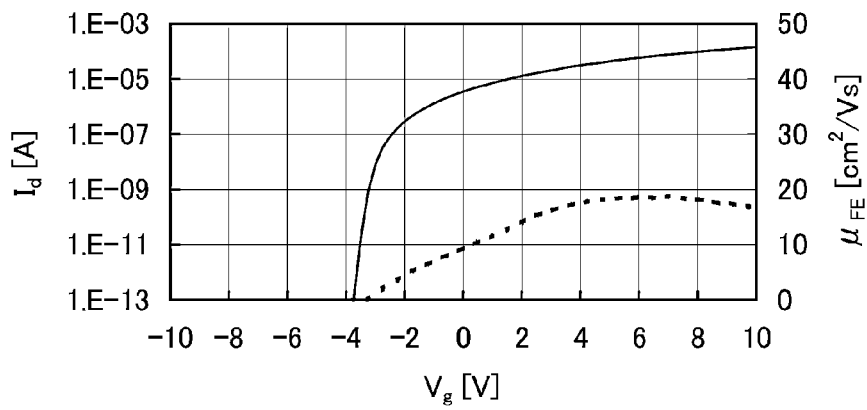
FIGS. 16A to 16C show characteristics of a transistor formed using an oxide semiconductor film.
Figure 16B:
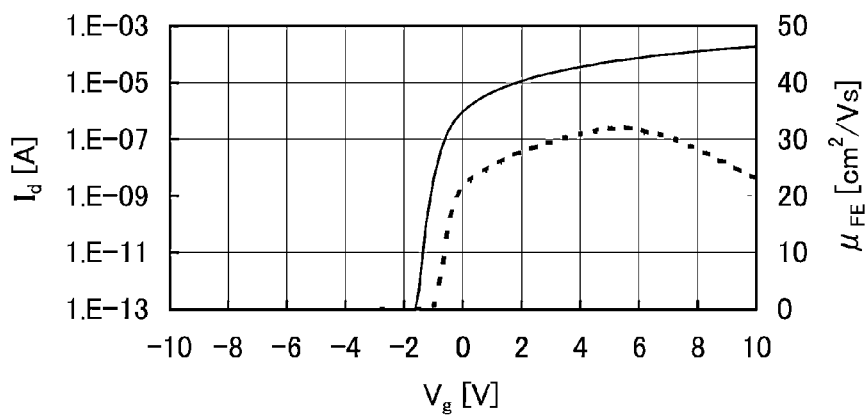
Figure 16C:
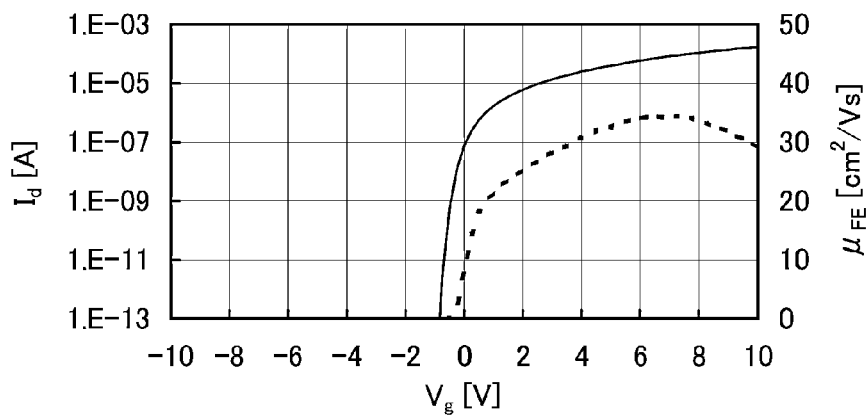

As an example, FIGS. 16A to 16C are graphs each showing characteristics of a transistor in which an oxide semiconductor film containing In, Sn, and Zn as main components and having a channel length L of 3 μm and a channel width W of 10 μm, and a gate insulating film with a thickness of 100 nm are used. Note that $V_d$ was set to 10 V.

FIG. 16A shows characteristics of a transistor whose oxide semiconductor film containing In, Sn, and Zn as main components was formed by a sputtering method without heating a substrate intentionally. The field-effect mobility of the transistor is 18.8 $cm^2$/Vsec. On the other hand, when the oxide semiconductor film containing In, Sn, and Zn as main components is formed while heating the substrate intentionally, the field-effect mobility can be improved. FIG. 16B shows characteristics of a transistor whose oxide semiconductor film containing In, Sn, and Zn as main components was formed while heating a substrate at 200° C. The field-effect mobility of the transistor is 32.2 $cm^2$/Vsec.

The field-effect mobility can be further improved by performing heat treatment after formation of the oxide semiconductor film containing In, Sn, and Zn as main components. FIG. 16C shows characteristics of a transistor whose oxide semiconductor film containing In, Sn, and Zn as main components was formed by sputtering at 200° C. and then subjected to heat treatment at 650° C. The field-effect mobility of the transistor is 34.5 $cm^2$/Vsec.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. In addition, the oxide semiconductor can be crystallized by being highly purified by removal of impurities from the oxide semiconductor. In the case of using such a purified non-single-crystal oxide semiconductor, ideally, a field-effect mobility exceeding 100 cm$^2$/Vsec is expected to be achieved.

The oxide semiconductor containing In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film that contains In, Sn, and Zn as main components and is formed without heating a substrate intentionally is used as a channel formation region, the threshold voltage tends to be shifted negatively. In contrast, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 16A and 16B.

Note that the threshold voltage can also be controlled by changing the ratio of In to Sn and Zn; when the composition ratio of In to Sn and Zn is 2:1:3, a normally-off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$-$I_d$ characteristics of the transistors were measured at a substrate temperature of 25° C. and $V_d$ of 10 V. Then, the substrate temperature was set to 150° C. and $V_d$ was set to 0.1 V. After that, $V_g$ of 20 V was applied so that the intensity of an electric field applied to gate insulating films was 2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a positive BT test.

In a similar manner, first, $V_g$-$I_d$ characteristics of the transistors were measured at a substrate temperature of 25° C. and $V_d$ of 10 V. Then, the substrate temperature was set at 150° C. and $V_d$ was set to 0.1 V. After that, $V_g$ of −20 V was applied so that the intensity of an electric field applied to the gate insulating films was −2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a negative BT test.

Figure 17A:
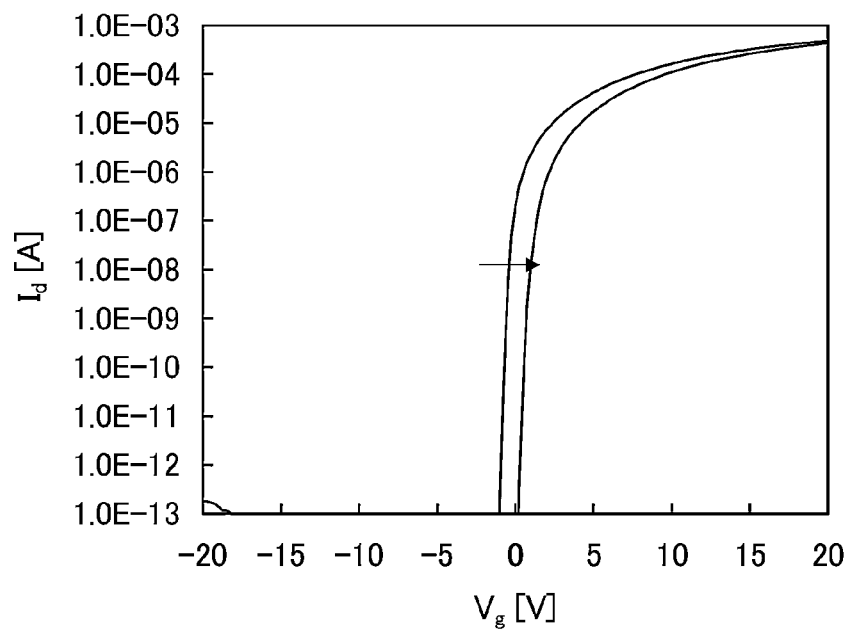
FIGS. 17A and 17B each show $V_g$-$I_d$ characteristics of a transistor of Sample 1 after a BT test.
Figure 17B:
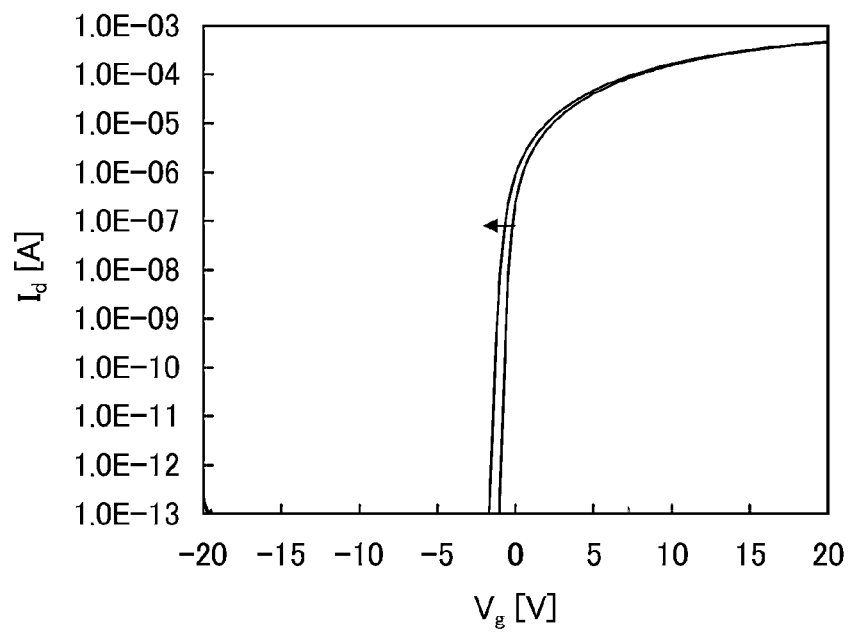
Figure 18A:
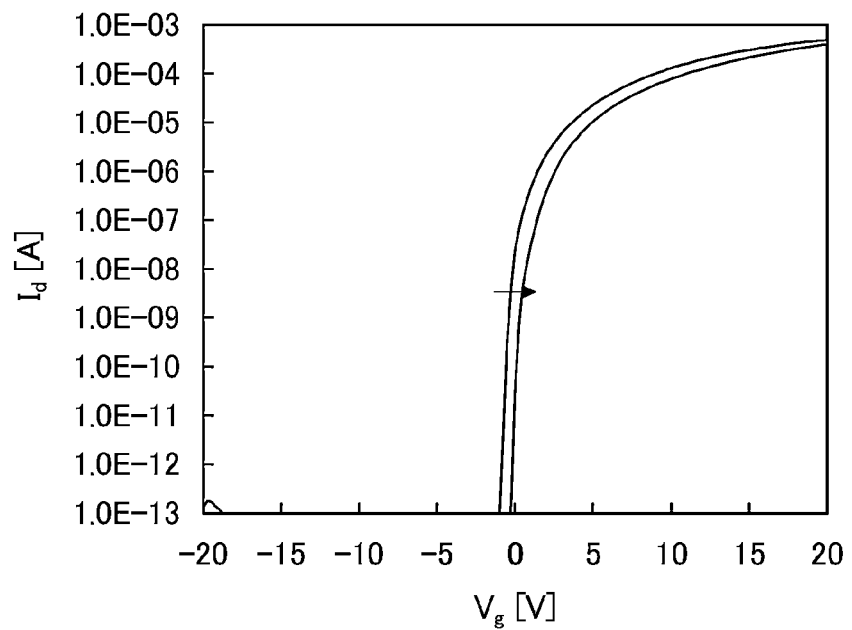
FIGS. 18A and 18B each show $V_g$-$I_d$ characteristics of a transistor of Sample 2 after a BT test.
Figure 18B:
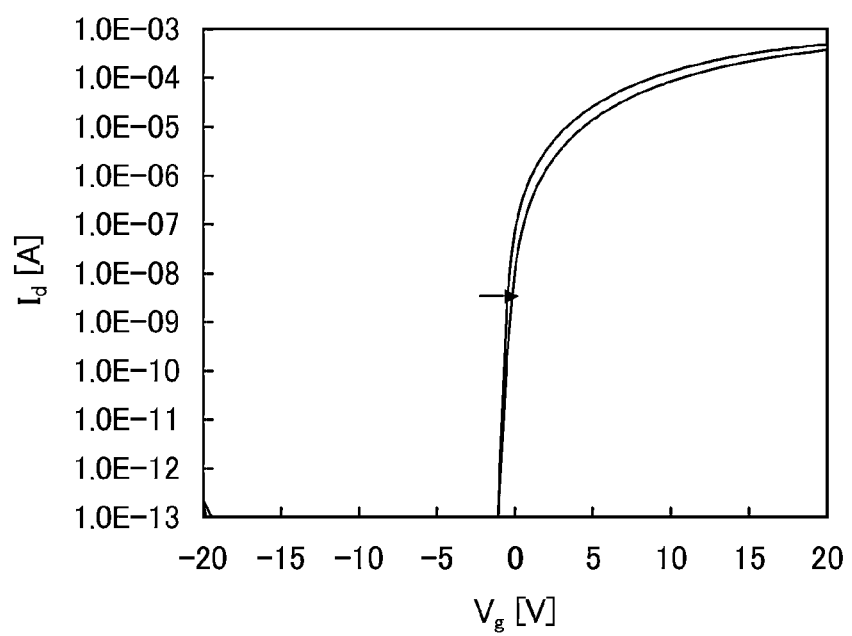

FIGS. 17A and 17B show results of the positive BT test and the negative BT test, respectively, of Sample 1. FIGS. 18A and 18B show results of the positive BT test and the negative BT test, respectively, of Sample 2.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby the effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen vacancy is easily caused in the oxide semiconductor or at an interface between the oxide semiconductor and a film stacked over the oxide semiconductor; when excess oxygen is included in the oxide semiconductor by the heat treatment, oxygen vacancy caused constantly can be compensated for with excess oxygen. The excess oxygen is mainly oxygen existing between lattices. When the concentration of oxygen is set in the range of $1\times10^{16}$ atoms/cm$^3$ to $2\times10^{20}$ atoms/cm$^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film that is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed with X-ray diffraction.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for forming Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample formed in this manner was used as Sample A.

Next, a sample formed by a method similar to that of Sample A was subjected to heat treatment at 650° C. As the heat treatment, heat treatment in a nitrogen atmosphere was performed first for one hour and heat treatment in an oxygen atmosphere was further performed for one hour without lowering the temperature. A sample formed in this manner was used as Sample B.

Figure 21:
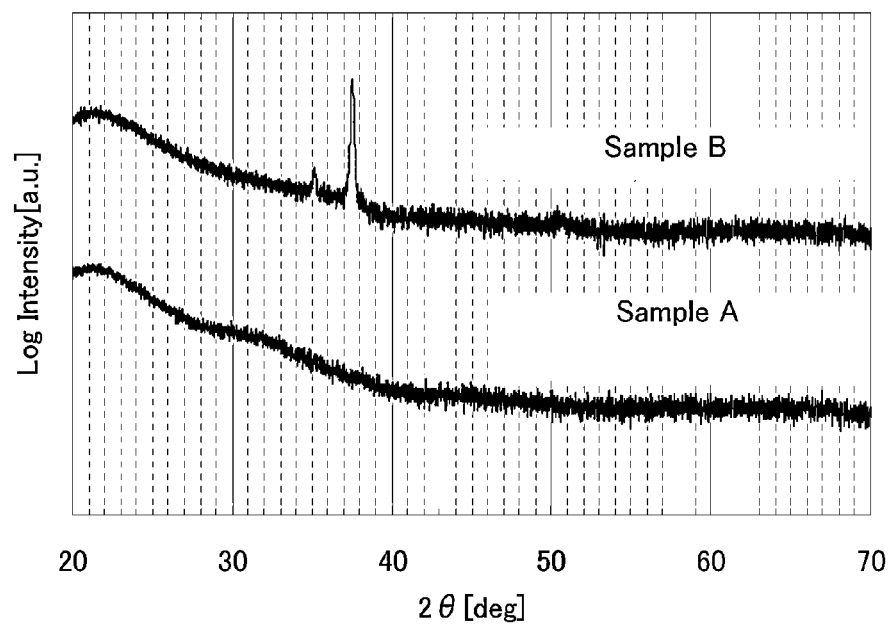
FIG. 21 shows XRD spectra of Sample A and Sample B.

FIG. 21 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor containing In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being contained in the film or an effect of removing hydrogen and a hydroxyl group from the film. That is, an oxide semiconductor can be purified by removing hydrogen serving as a donor impurity from the oxide semiconductor, whereby a normally-off transistor can be obtained. The purification of an oxide semiconductor enables the off-state current of the transistor to be 1 aA/μm or lower. Here, the unit of the off-state current represents current per micrometer of a channel width.

Figure 22:
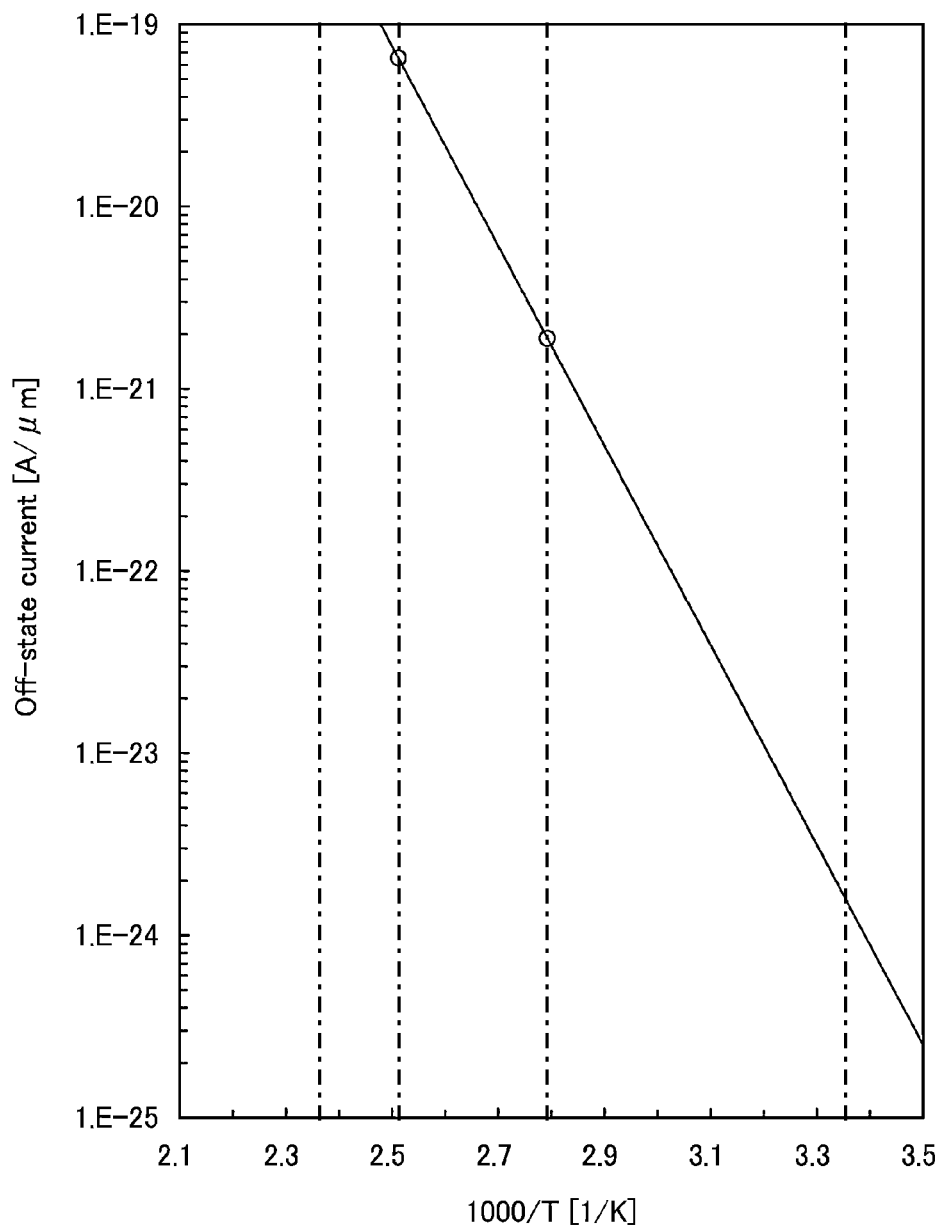
FIG. 22 shows a relation between off-state current of a transistor and substrate temperature in measurement.

FIG. 22 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 22, the off-state current was 0.1 aA/μm ($1 \times 10^{-19}$ A/μm) or smaller and 10 zA/μm ($1 \times 10^{-20}$ A/μm) or smaller when the substrate temperature was 125° C. and 85° C., respectively. The proportional relation between the logarithm of the off-state current and the inverse of the temperature suggests that the off-state current at room temperature (27° C.) is 0.1 zA/μm ($1 \times 10^{-22}$ A/μm) or smaller. Hence, the off-state current can be 1 aA/μm ($1 \times 10^{-18}$ A/μm) or smaller, 100 zA/μm ($1 \times 10^{-19}$ A/μm) or smaller, and 1 zA/μm ($1 \times 10^{-21}$ A/μm) or smaller at 125° C., 85° C., and room temperature, respectively.

Note that in order to prevent hydrogen and moisture from being contained in the oxide semiconductor film during formation of the film, it is preferable to increase the purity of a sputtering gas by sufficiently suppressing leakage from the outside of a deposition chamber and degasification from an inner wall of the deposition chamber. For example, a gas with a dew point of −70° C. or lower is preferably used as the sputtering gas in order to prevent moisture from being contained in the film. In addition, it is preferable to use a target that is purified so as not to contain impurities such as hydrogen and moisture. Although it is possible to remove moisture from a film of an oxide semiconductor containing In, Sn, and Zn as main components by heat treatment, a film that does not contain moisture originally is preferably formed because moisture is released from the oxide semiconductor containing In, Sn, and Zn as main components at a higher temperature than from an oxide semiconductor containing In, Ga, and Zn as main components.

The relation between the substrate temperature and electrical characteristics of the transistor of the sample, on which heat treatment at 650° C. was performed after formation of the oxide semiconductor film, was evaluated.

The transistor used for the measurement has a channel length L of 3 μm, a channel width W of 10 μm, $L_{ov}$ of 0 μm, and dW of 0 μm. Note that $V_d$ was set to 10 V. Note that the substrate temperatures were −40° C., −25° C., 25° C., 75° C., 125° C., and 150° C. Here, in the transistor, the width of a portion where a gate electrode overlaps with one of a pair of electrodes is referred to as $L_{ov}$, and the width of a portion of the pair of electrodes, which does not overlap with an oxide semiconductor film, is referred to as dW.

Figure 19:
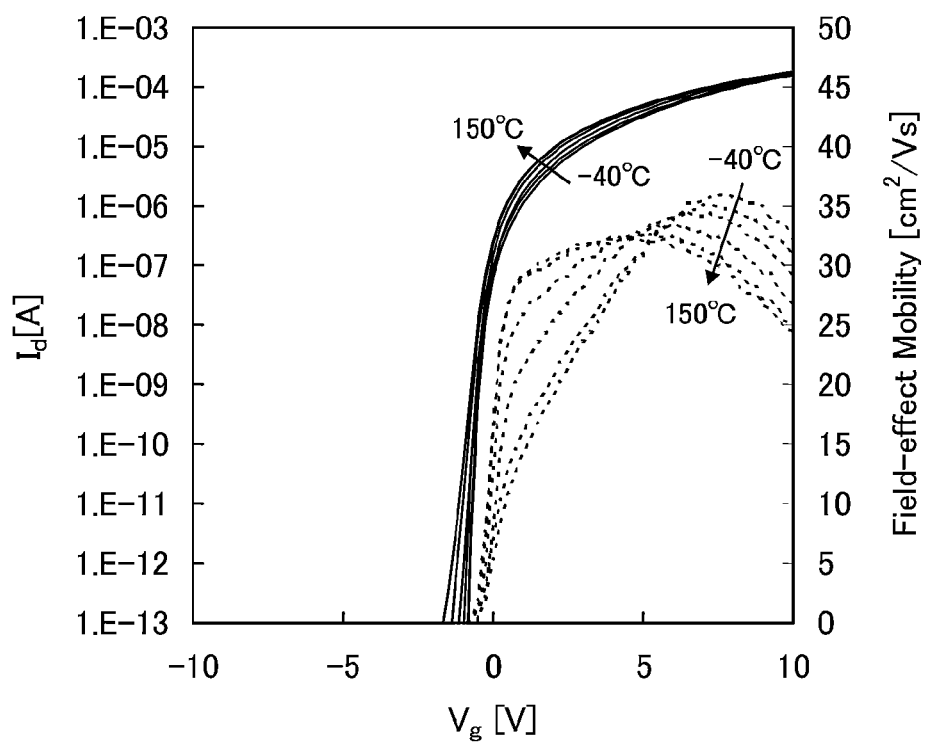
FIG. 19 shows $V_g$ dependence of $I_d$ and field-effect mobility.
Figure 20A:
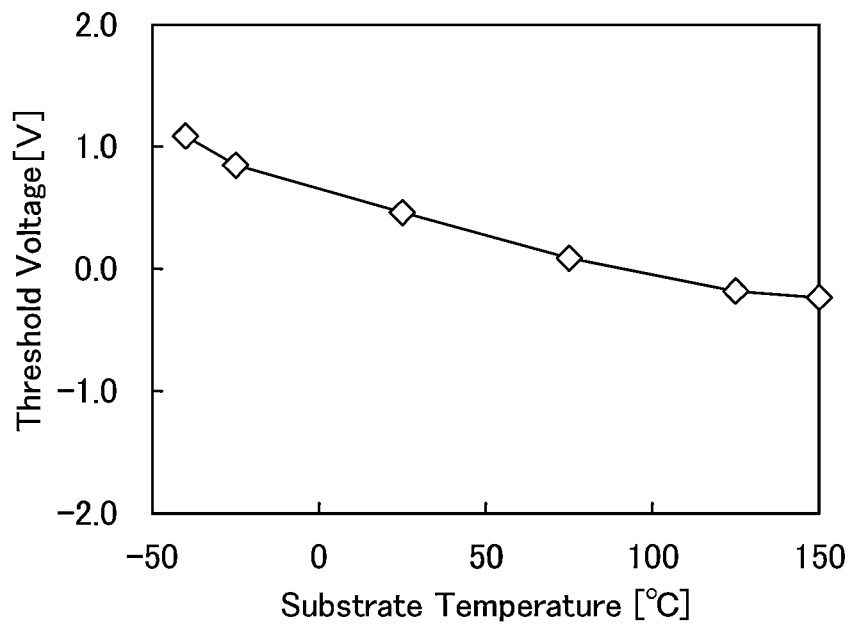
FIG. 20A shows a relation between substrate temperature and threshold voltage.

FIG. 19 shows the $V_g$ dependence of $I_d$ (a solid line) and field-effect mobility (a dotted line). FIG. 20A shows a relation between the substrate temperature and the threshold voltage, and FIG. 20B shows a relation between the substrate temperature and the field-effect mobility.

From FIG. 20A, it is found that the threshold voltage gets lower as the substrate temperature increases. Note that the threshold voltage is decreased from 1.09 V to −0.23 V in the range from −40° C. to 150° C.

Figure 20B:
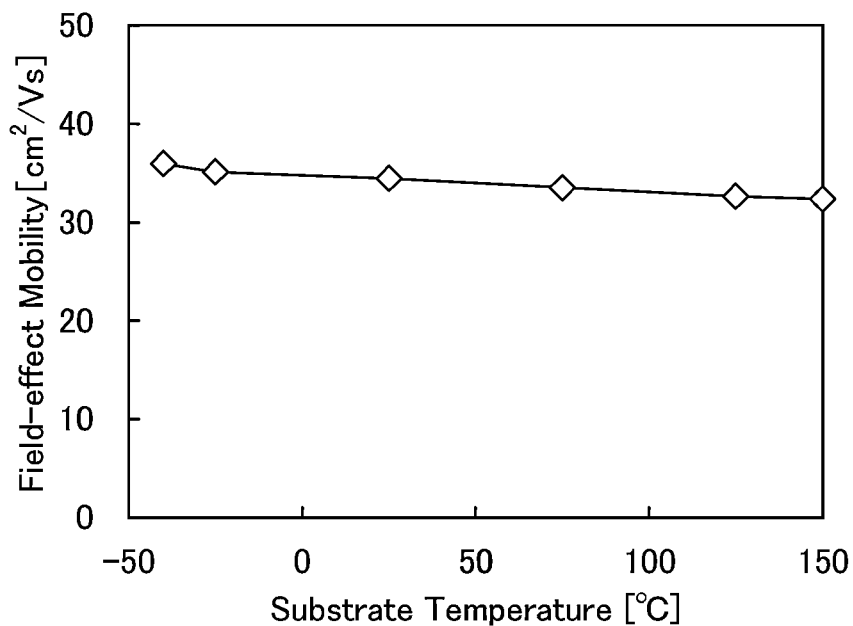
FIG. 20B shows a relation between substrate temperature and field-effect mobility.

From FIG. 20B, it is found that the field-effect mobility gets lower as the substrate temperature increases. Note that the field-effect mobility is decreased from 36 cm²/Vs to 32 cm²/Vs in the range from −40° C. to 150° C. Thus, it is found that variation in electrical characteristics is small in the above temperature range.

In a transistor in which such an oxide semiconductor containing In, Sn, and Zn as main components is used as a channel formation region, a field-effect mobility of 30 cm²/Vsec or higher, preferably 40 cm²/Vsec or higher, further preferably 60 cm²/Vsec or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electrical characteristics can be ensured in a temperature range needed for operation of a transistor.

EXPLANATION OF REFERENCE

100: D flip-flop circuit, 102: first transmission gate, 104: first inverter, 106: functional circuit, 107: clocked inverter, 108: second transmission gate, 110: second inverter, 112: clocked inverter, 114: node, 116: node, 120: first p-channel transistor, 122: second p-channel transistor, 124: transistor, 126: data holding portion, 128: capacitor, 130: D flip-flop circuit, 140: first p-channel transistor, 142: second p-channel transistor, 144: third p-channel transistor, 146: transistor, 148: data holding portion, 150: capacitor, 200: semiconductor substrate provided with a p-channel transistor and an n-channel transistor, 201: high-concentration impurity region, 202: low-concentration impurity region, 203: gate insulating film, 204: gate electrode, 205: interlayer insulating film, 210: transistor having a channel formation region in an oxide semiconductor layer, 211: oxide semiconductor layer, 212a: source electrode, 212b: drain electrode, 213: gate insulating film, 214a: electrode, 214b: gate electrode, 301: base insulating film, 302: embedded insulating film, 303a: semiconductor region, 303b: semiconductor region, 303c: semiconductor region, 304: gate insulating film, 305: gate, 306a: sidewall insulator, 306b: sidewall insulator, 307: insulating film, 308a: source, and 308b: drain.

This application is based on Japanese Patent Application serial no. 2011-108358 filed with Japan Patent Office on May 13, 2011, the entire contents of which are hereby incorporated by reference.

The invention claimed is:
1. A semiconductor device comprising:
a circuit, the circuit comprising an input terminal, a first transmission gate, a second transmission gate, a first inverter, a second inverter, a functional circuit, a clocked inverter, and an output terminal, the functional circuit comprising:
a first transistor, a second transistor, a third transistor, and a capacitor,
wherein the first transistor and the second transistor are p-channel transistors,
wherein one of a source and a drain of the first transistor is electrically connected to a first wiring,
wherein the other of the source and the drain of the first transistor is electrically connected to one of a source and a drain of the second transistor,
wherein the other of the source and the drain of the second transistor is electrically connected to one of a source and a drain of the third transistor,
wherein the other of the source and the drain of the third transistor is electrically connected to one of electrodes of the capacitor, and
wherein the other of the electrodes of the capacitor is electrically connected to a second wiring,
wherein the input terminal is electrically connected to a first terminal of the first transmission gate, wherein a second terminal of the first transmission gate is electrically connected to a first terminal of the first inverter and the other of the source and the drain of the second transistor, wherein a second terminal of the first inverter and a gate of the second transistor are electrically connected to a first terminal of the second transmission gate, wherein a second terminal of the second transmission gate is electrically connected to a first terminal of the second inverter and a second terminal of the clocked inverter, and wherein a second terminal of the second inverter and a first terminal of the clocked inverter are electrically connected to the output terminal.

2. The semiconductor device according to claim 1,
wherein the first wiring and the second wiring are each a power supply potential line supplied with a constant potential, and
wherein a potential supplied to the first wiring is higher than a potential supplied to the second wiring.

3. The semiconductor device according to claim 1,
wherein a gate of the first transistor is supplied with a timing signal which is set to a high level or a low level,
wherein the clocked inverter is configured to be supplied with a clock signal,
wherein before the circuit is switched to an off state, the third transistor is turned off,
wherein when the circuit is switched to an on state after the circuit is switched to the off state, the clock signal is not input to the clocked inverter and a wiring to which the clock signal is input is held at a constant potential,
wherein after the circuit is switched to the on state, the timing signal is set to the high level and then, the third transistor is turned on, and
wherein after the third transistor is turned on, a same signal as the clock signal is input as the timing signal.

4. The semiconductor device according to claim 1, wherein an off-state current per micrometer of unit channel width of the third transistor is smaller than or equal to 10 aA at room temperature.

5. The semiconductor device according to claim 1, wherein the third transistor comprises an oxide semiconductor layer.

6. The semiconductor device according to claim 5, wherein the oxide semiconductor layer includes crystal.

7. A semiconductor device comprising:
a circuit, the circuit comprising an input terminal, a first transmission gate, a second transmission gate, a first inverter, a second inverter, a functional circuit, a clocked inverter, and an output terminal, the functional circuit comprising a first transistor, a second transistor, a third transistor, a fourth transistor, and a capacitor,
wherein the first transistor and the second transistor are p-channel transistors,
wherein a node is electrically connected to one of a source and a drain of the fourth transistor via the third transistor,
wherein the other of the source and the drain of the fourth transistor is electrically connected to a first wiring,
wherein one of a source and a drain of the first transistor is electrically connected to the first wiring,
wherein the other of the source and the drain of the first transistor is electrically connected to one of a source and a drain of the second transistor,
wherein the other of the source and the drain of the second transistor is electrically connected to one of a source and a drain of the third transistor,
wherein the other of the source and the drain of the third transistor is electrically connected to one of electrodes of the capacitor, and
wherein the other of the electrodes of the capacitor is electrically connected to a second wiring,
wherein the input terminal is electrically connected to a first terminal of the first transmission gate,
wherein a second terminal of the first transmission gate is electrically connected to a first terminal of the first inverter and the other of the source and the drain of the second transistor,
wherein a second terminal of the first inverter and a gate of the second transistor are electrically connected to a first terminal of the second transmission gate,
wherein a second terminal of the second transmission gate is electrically connected to a first terminal of the second inverter and a second terminal of the clocked inverter, and
wherein a second terminal of the second inverter and a first terminal of the clocked inverter are electrically connected to the output terminal.

8. The semiconductor device according to claim 7, wherein a gate of the fourth transistor is configured to be supplied with a reset signal.

9. The semiconductor device according to claim 7,
wherein the first wiring and the second wiring are each a power supply potential line supplied with a constant potential, and
wherein a potential supplied to the first wiring is higher than a potential supplied to the second wiring.

10. The semiconductor device according to claim 7,
wherein a gate of the first transistor is supplied with a timing signal which is set to a high level or a low level,
wherein the clocked inverter is configured to be supplied with a clock signal,
wherein before the circuit is switched to an off state, the third transistor is turned off,
wherein when the circuit is switched to an on state after the circuit is switched to the off state, the clock signal is not input to the clocked inverter and a wiring to which the clock signal is input is held at a constant potential,
wherein after the circuit is switched to the on state, the timing signal is set to the high level and then, the third transistor is turned on, and wherein after the third transistor is turned on, a same signal as the clock signal is input as the timing signal.

11. The semiconductor device according to claim 7, wherein an off-state current per micrometer of unit channel width of the third transistor is smaller than or equal to 10 aA at room temperature.

12. The semiconductor device according to claim 7, wherein the third transistor comprises an oxide semiconductor layer.

13. The semiconductor device according to claim 12, wherein the oxide semiconductor layer includes crystal.

14. A semiconductor device comprising:
a flip-flop circuit comprising an inverter and a functional circuit,
wherein the functional circuit comprising a first transistor, a second transistor comprising an oxide semiconductor layer and a capacitor,
wherein the first transistor is a p-channel transistor,
wherein the first transistor comprises a single crystal semiconductor layer,
wherein one of a source and a drain of the first transistor is electrically connected to a first terminal of the inverter and one of a source and a drain of the second transistor,
wherein a gate of the first transistor is electrically connected to a second terminal of the inverter, and
wherein one of electrodes of the capacitor is electrically connected to the other of a source or a drain of the transistor.

15. The semiconductor device according to claim 14, wherein an off-state current per micrometer of unit channel width of the second transistor is smaller than or equal to 10 aA at room temperature.

16. The semiconductor device according to claim 14, wherein the oxide semiconductor layer includes crystal.

17. A semiconductor device comprising:
a circuit, the circuit comprising a first transistor, a second transistor, a third transistor, and a capacitor,
wherein the first transistor and the second transistor are p-channel transistors,
wherein the third transistor comprises an oxide semiconductor layer,
wherein one of a source and a drain of the first transistor is electrically connected to a first wiring,
wherein the other of the source and the drain of the first transistor is electrically connected to one of a source and a drain of the second transistor,
wherein the other of the source and the drain of the second transistor is electrically connected to one of a source and a drain of the third transistor,
wherein the other of the source and the drain of the third transistor is electrically connected to one of electrodes of the capacitor, and
wherein the other of the electrodes of the capacitor is electrically connected to a second wiring.

18. The semiconductor device according to claim 17, wherein the circuit further comprises a fourth transistor,
wherein a node is electrically connected to one of a source and a drain of the fourth transistor via the third transistor,
wherein the other of the source and the drain of the fourth transistor is electrically connected to the first wiring, and
wherein a gate of the fourth transistor is configured to be supplied with a reset signal.

19. The semiconductor device according to claim 17, wherein the first wiring and the second wiring are each a power supply potential line supplied with a constant potential, and
wherein a potential supplied to the first wiring is higher than a potential supplied to the second wiring.

20. The semiconductor device according to claim 17, wherein an off-state current per micrometer of unit channel width of the third transistor is smaller than or equal to 10 aA at room temperature.

21. The semiconductor device according to claim 17, wherein the oxide semiconductor layer includes crystal.

* * * * *

UNITED STATES PATENT AND TRADEMARK OFFICE
CERTIFICATE OF CORRECTION

PATENT NO.       : 8,564,331 B2                            Page 1 of 1
APPLICATION NO.  : 13/461811
DATED            : October 22, 2013
INVENTOR(S)      : Seiichi Yoneda It is certified that error appears in the above-identified patent and that said Letters Patent is hereby corrected as shown below:

In the Specification

Column 16, line 31, "$(In_2SnZn_3O_g)$" should be --$(In_2SnZn_3O_8)$--;

Column 27, line 8, "when 20" should be --when 2Θ--.

Signed and Sealed this
Eighteenth Day of February, 2014

Michelle K. Lee
*Deputy Director of the United States Patent and Trademark Office*